United States Patent
Kitade

(10) Patent No.: US 11,662,399 B2
(45) Date of Patent: May 30, 2023

(54) MAGNETIC SENSOR

(71) Applicant: Rohm Co., Ltd., Kyoto (JP)

(72) Inventor: Tetsuya Kitade, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 17/703,359

(22) Filed: Mar. 24, 2022

(65) Prior Publication Data

US 2022/0308129 A1    Sep. 29, 2022

(30) Foreign Application Priority Data

Mar. 26, 2021    (JP) .............................. JP2021-053865

(51) Int. Cl.
*G01R 33/07*    (2006.01)
*G01D 5/14*    (2006.01)
*G01R 33/00*    (2006.01)

(52) U.S. Cl.
CPC ........... *G01R 33/072* (2013.01); *G01D 5/145* (2013.01); *G01R 33/0017* (2013.01)

(58) Field of Classification Search
CPC combination set(s) only.
See application file for complete search history.

(56) References Cited

U.S. PATENT DOCUMENTS

| | | | | |
|---|---|---|---|---|
| 2009/0295380 A1* | 12/2009 | Motz | ................... | G01R 33/072 324/251 |
| 2013/0214774 A1* | 8/2013 | Cesaretti | ............ | G01R 33/0023 324/252 |
| 2018/0011140 A1* | 1/2018 | Chaware | ............ | G01R 31/2884 |
| 2019/0195661 A1* | 6/2019 | Mano | .................. | G01R 33/072 |
| 2022/0075008 A1* | 3/2022 | Romero | ................. | G01D 5/145 |

FOREIGN PATENT DOCUMENTS

JP    2019-113390    7/2019

* cited by examiner

*Primary Examiner* — Alvaro E Fortich
(74) *Attorney, Agent, or Firm* — Fish & Richardson P.C.

(57) ABSTRACT

A magnetic sensor that includes a Hall element; a switch circuit configured to switch a direction of a drive current supplied to the Hall element between a first direction and a second direction; a magnetic field detection circuit configured to execute a detection operation for detecting a target magnetic field acting on the Hall element, based on a first difference between a Hall voltage generated in the Hall element when the drive current is supplied to the Hall element in the first direction and a Hall voltage generated in the Hall element when the drive current is supplied to the Hall element in the second direction; and a test magnetic field generation circuit configured to generate a test magnetic field different from the target magnetic field in a test operation.

6 Claims, 23 Drawing Sheets

First drive state (Dz1)

Second drive state (Dz2)

[Drive state Dxy1]

[Drive state Dxy2]

[XY-axis detection mode]

[Test operation]

MAGNETIC SENSOR

CROSS-REFERENCE TO RELATED APPLICATION

This application is based upon and claims the benefit of priority from Japanese Patent Application No. 2021-053865, filed on Mar. 26, 2021, the entire contents of which are incorporated herein by reference.

TECHNICAL FIELD

The present disclosure relates to a magnetic sensor.

BACKGROUND

A magnetic sensor can detect a magnetic field using a Hall element. There is a technique for canceling an offset related to the Hall element when detecting the magnetic field.

If the magnetic sensor can perform a self-test to check whether the magnetic sensor is in a normally operable state, the reliability of the magnetic sensor will increase. At this time, it is more preferable if the self-test can be realized with a simple configuration.

SUMMARY

Some embodiments of the present disclosure provide a magnetic sensor capable of realizing a self-test with a simple configuration.

According to one embodiment of the present disclosure, there is provided a magnetic sensor that includes a Hall element; a switch circuit configured to switch a direction of a drive current supplied to the Hall element between a first direction and a second direction; a magnetic field detection circuit configured to execute a detection operation for detecting a target magnetic field acting on the Hall element, based on a first difference between a Hall voltage generated in the Hall element when the drive current is supplied to the Hall element in the first direction and a Hall voltage generated in the Hall element when the drive current is supplied to the Hall element in the second direction; and a test magnetic field generation circuit configured to generate a test magnetic field different from the target magnetic field in a test operation, wherein the magnetic field detection circuit is configured to, in the test operation, generate a test result signal corresponding to a second difference between a Hall voltage generated in the Hall element in a first test section and a Hall voltage generated in the Hall element in a second test section, and wherein the direction of the drive current supplied to the Hall element is common to the first test section and the second test section, and a direction of the test magnetic field acting on the Hall element is opposite in the first test section and the second test section.

BRIEF DESCRIPTION OF DRAWINGS

The accompanying drawings, which are incorporated in and constitute a part of the specification, illustrate embodiments of the present disclosure.

DETAILED DESCRIPTION

Figure 1:
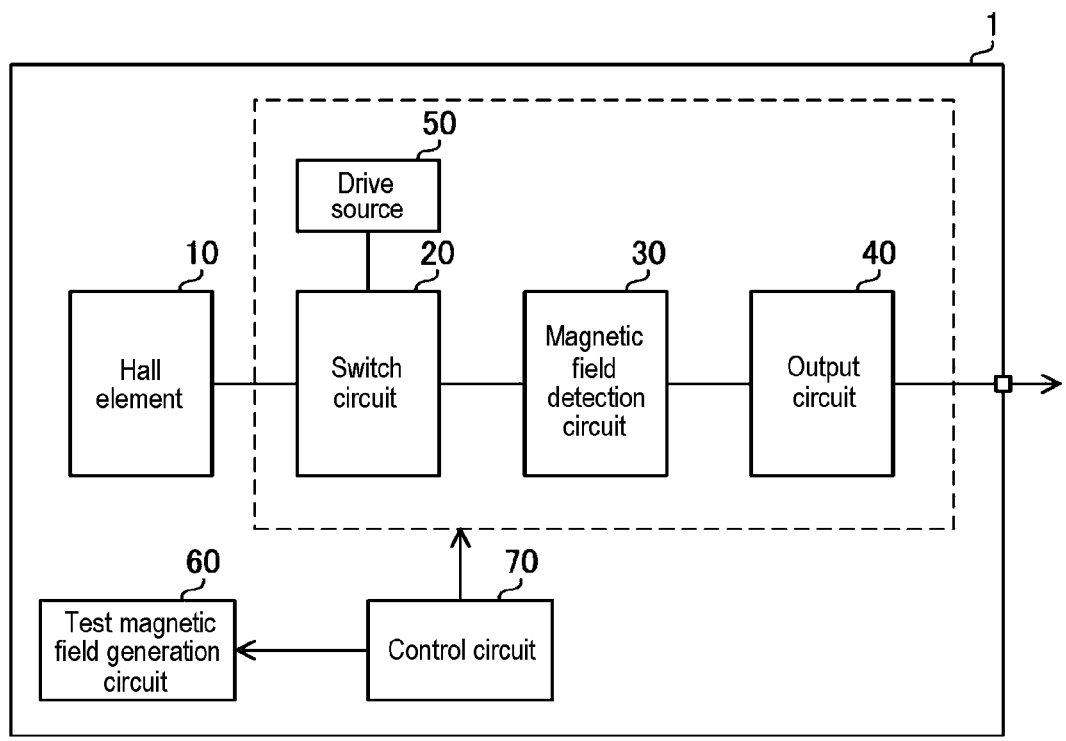
FIG. 1 is a configuration diagram of a magnetic sensor according to a first embodiment of the present disclosure.

Hereinafter, the embodiments of the present disclosure will be specifically described with reference to the drawings. In each of the referenced figures, the same parts are designated by the same reference numerals, and duplicate explanations regarding the same parts will be omitted in principle. In this specification, for the sake of simplicity of description, by describing a symbol or a code that refers to information, a signal, a physical quantity, an element, a part, or the like, the names of the information, the signal, the physical quantity, the element, the part, or the like corresponding to the symbol or the code may sometimes be omitted or abbreviated.

First, some terms used in the description of the embodiments of the present disclosure will be defined. The term "ground" refers to a reference conductive portion having a reference potential of 0 V (zero volt) or refers to the potential of 0 V itself. The reference conductive portion is formed of a conductor such as metal or the like. The potential of 0V may be referred to as a ground potential. In the embodiments of the present disclosure, the voltage shown without any particular reference represents the potential seen from ground. The term "level" refers to the level of a potential. A high level has a higher potential than a low level for any signal or voltage of interest. For any signal or voltage of interest, the expression "a signal or voltage being at a high level" strictly means that a signal or voltage level is at a high level, and the expression "a signal or voltage being at a low level" strictly means that a signal or voltage level is at a low level. Unless otherwise specified, the connection between a plurality of circuit-constituting parts such as arbitrary circuit elements, wirings, nodes, and the like may be understood to mean electrical connection.

First Embodiment

A first embodiment of the present disclosure will be described. It is noted that the first embodiment described here and the second to fourth embodiments described later can be arbitrarily combined. FIG. 1 shows a configuration diagram of a magnetic sensor 1 according to the first embodiment. The magnetic sensor 1 according to the first embodiment includes a Hall element 10, a switch circuit 20, a magnetic field detection circuit 30, an output circuit 40, a drive source 50, a test magnetic field generation circuit 60, and a control circuit 70.

The Hall element 10 is a so-called horizontal Hall element, and the magnetic sensor 1 can detect a magnetic field in a Z-axis direction by using the Hall element 10. As used herein, the Z axis is parallel to the direction orthogonal to the surface of a semiconductor substrate on which the Hall element 10 is formed. The Hall element 10 is formed on a plane orthogonal to the Z axis. Further, in this specification, it is assumed that the X axis, the Y axis and the Z axis are orthogonal to each other.

Figure 2:
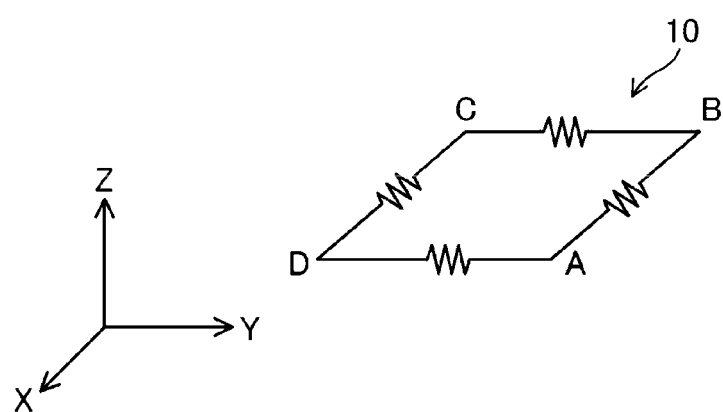
FIG. 2 is a diagram showing an equivalent circuit of a Hall element according to the first embodiment of the present disclosure.

As shown in FIG. 2, the Hall element 10 includes electrodes A, B, C and D, and an equivalent circuit of the Hall element 10 is represented by a bridge circuit including a resistor between the electrodes A and B, a resistor between the electrodes B and C, a resistor between the electrodes C and D, and a resistor between the electrodes D and A. The electrode may be read as a terminal. The Hall element 10 has a square shape on a plane orthogonal to the Z axis and has a point-symmetrical structure with respect to the center of the square. The Hall element 10 is manufactured so that the resistance values of the four resistors in the bridge circuit match as much as possible. However, an offset may occur due to an error in the resistance values. In the magnetic sensor 1, the offset can be canceled by using the switch circuit 20.

The method of canceling the offset will be described with reference to FIGS. 3 and 4. Now, consideration is given to a case where only the resistance value of the resistor between the electrodes A and D among the resistors constituting the bridge circuit is (R+α) and the resistance values of the other three resistors are R. VDD represents a power supply voltage. The power supply voltage VDD has a predetermined positive DC voltage value.

Figure 3:
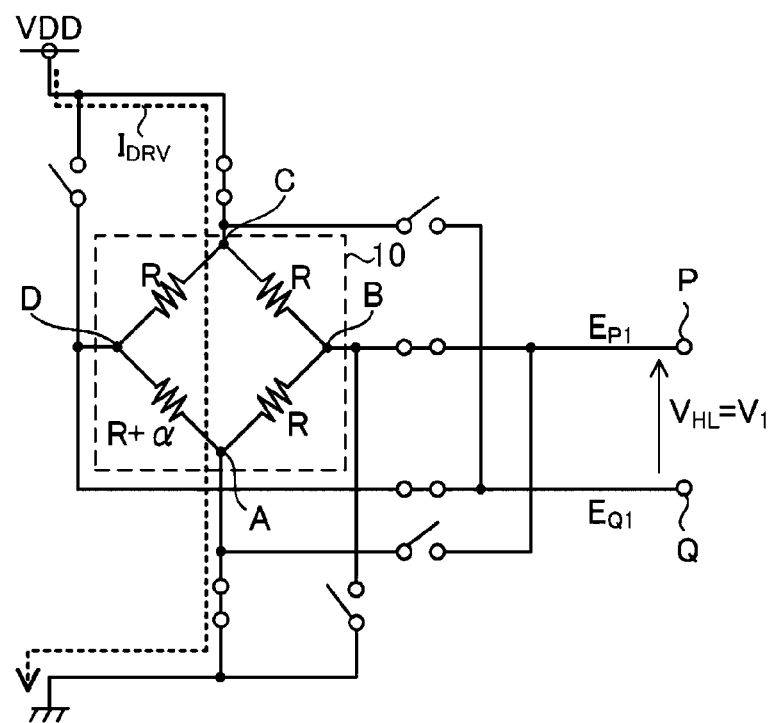
FIG. 3 is a diagram showing a first drive state of the Hall element according to the first embodiment of the present disclosure.

The drive state of the Hall element 10 shown in FIG. 3 is referred to as a first drive state. The first drive state shown in FIG. 3 may be referred to as a drive state Dz1 in other embodiments described later. In the first drive state, the power supply voltage VDD is applied to the electrode C, and the electrode A is connected to the ground, whereby a drive current is supplied from the electrode C toward the electrode A. In this embodiment, the drive current is referred to by a symbol "$I_{DRV}$". Further, in the first drive state, the electrode B is connected to a node P and the electrode D is connected to a node Q. Then, in the first drive state, the node P has a potential $E_{P1}$ represented by the following equation (a1), and the node Q has a potential $E_{Q1}$ represented by the following equation (a2). The voltage applied between the nodes P and Q with reference to the potential of the node Q is represented by a symbol "$V_{HL}$". In the first drive state, "$V_{HL}=V_1$", and the voltage $V_1$ is represented by the following equation (a3) where S represents a Hall voltage generated in the Hall element 10 by the magnetic field in the Z-axis direction acting on the Hall element 10. In this disclosure, when a certain magnetic field acts on the Hall element, it means that the magnetic field is applied to the Hall element.

$$E_{P1} = VDD \times \frac{1}{2} \tag{a1}$$

-continued $$E_{Q1} = VDD \times \left(\frac{R+\alpha}{2R+\alpha}\right) \tag{a2}$$

$$V_1 = VDD \times \left(\frac{1}{2} - \frac{R+\alpha}{2R+\alpha}\right) + S = V_{OFFSET} + S \tag{a3}$$

Figure 4:
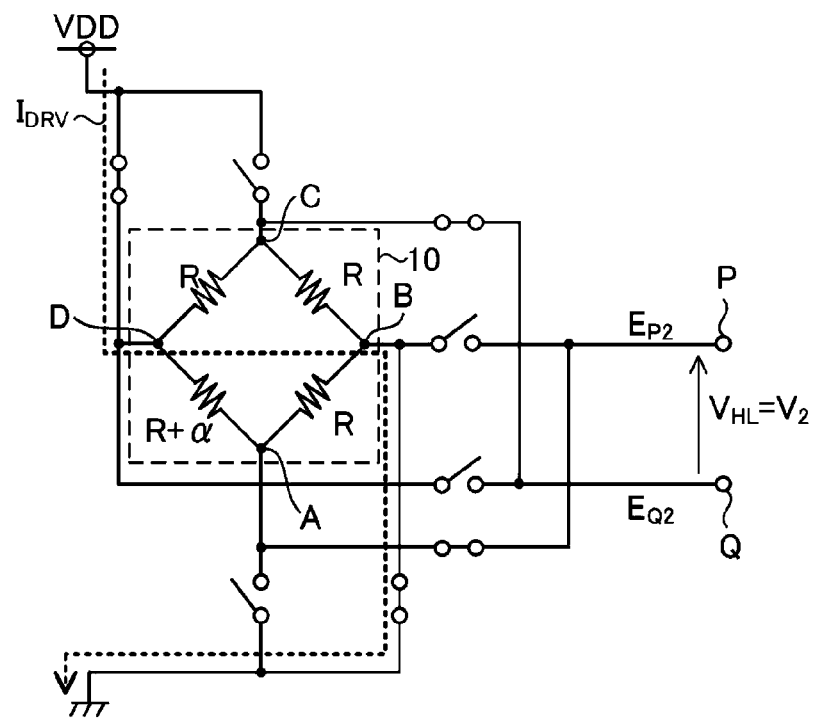
FIG. 4 is a diagram showing a second drive state of the Hall element according to the first embodiment of the present disclosure.

The drive state of the Hall element 10 shown in FIG. 4 is referred to as a second drive state. The second drive state shown in FIG. 4 may be referred to as a drive state Dz2 in other embodiments described later. In the second drive state, the power supply voltage VDD is applied to the electrode D, and the electrode B is connected to the ground, whereby the drive current $I_{DRV}$ is supplied from the electrode D toward the electrode B. Further, in the second drive state, the electrode A is connected to the node P and the electrode C is connected to the node Q. Then, in the second drive state, the node P has a potential $E_{P2}$ represented by the following equation (a4), and the node Q has a potential $E_{Q2}$ represented by the following equation (a5). Therefore, in the second drive state, "$V_{HL}=V_2$", and the voltage $V_2$ is represented by the following equation (a6). The voltage $V_{OFFSET}$ in the equation (a6) is the same as the voltage $V_{OFFSET}$ in the equation (a3).

$$E_{P2} = VDD \times \frac{R}{2R+\alpha} \tag{a4}$$

$$E_{Q2} = VDD \times \frac{1}{2} \tag{a5}$$

$$V_2 = VDD \times \left(\frac{R}{2R+\alpha} - \frac{1}{2}\right) - S = V_{OFFSET} - S \tag{a6}$$

Then, a difference voltage ($V_1-V_2$) between the voltage $V_1$ in the first drive state and the voltage $V_2$ in the second drive state is represented by the following equation (a7). As can be seen from the equation (a7), by taking the difference between the Hall voltages generated in the first and second drive states, the offset component of the Hall element 10 can be canceled and the detection sensitivity of the Hall voltage can be doubled.

$$V_1-V_2=2S \tag{a7}$$

Referring to FIG. 1, the switch circuit 20 switches between the first drive state and the second drive state under the control of the control circuit 70. That is, the switch circuit 20 switches a direction of the drive current $I_{DRV}$ supplied to the Hall element 10 between a first direction and a second direction. The first direction corresponds to the direction of the drive current $I_{DRV}$ in the first drive state, and the second direction corresponds to the direction of the drive current $I_{DRV}$ in the second drive state. The switch circuit 20 may be composed of a plurality of switching elements. The drive source 50 is a power source that supplies the drive current $I_{DRV}$ to the Hall element 10 through the switch circuit 20. Specifically, the drive source 50 applies the power supply voltage VDD between the electrodes A and C or between the electrodes B and D through the switch circuit 20. The drive source 50 may generate the power supply voltage VDD based on a predetermined input power supply voltage supplied to the magnetic sensor 1 from a power supply circuit (not shown) installed outside the magnetic sensor 1. Alternatively, the input power supply voltage itself may function as the power supply voltage VDD.

The magnetic field detection circuit 30 can detect an external magnetic field based on the above-mentioned offset cancellation principle. The operation for detecting an external magnetic field is called an external magnetic field detection operation. The external magnetic field is a magnetic field generated outside the magnetic sensor 1 and acting on the magnetic sensor 1 from the outside of the magnetic sensor 1. The external magnetic field is a magnetic field (target magnetic field) to be detected by the magnetic sensor 1. In the external magnetic field detection operation using the Hall element 10, the external magnetic field in the Z-axis direction can be detected. In this specification, the external magnetic field in the Z-axis direction and the Z-axis component of the external magnetic field are synonymous. The external magnetic field may have an axis component other than the Z-axis component. However, in the first embodiment, the external magnetic field refers to the magnetic field in the Z-axis direction.

Figure 5:
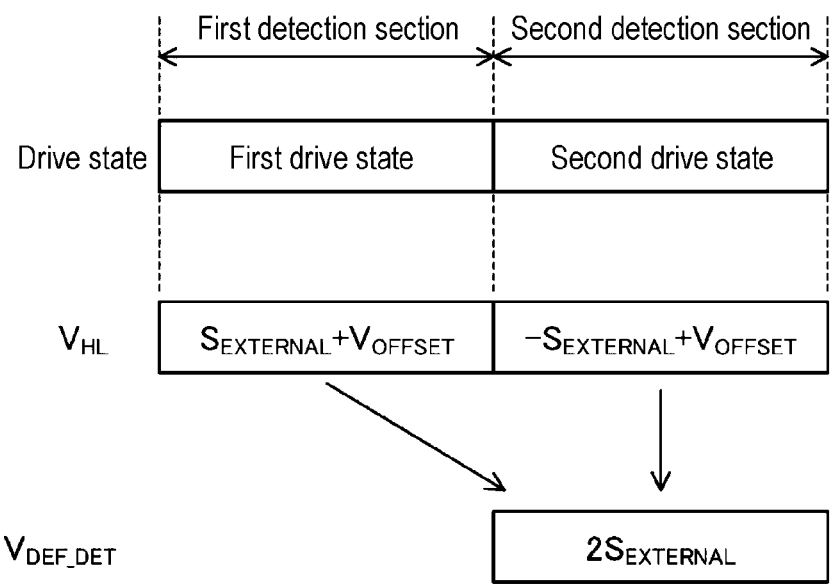
FIG. 5 is an explanatory diagram of an external magnetic field detection operation according to the first embodiment of the present disclosure.

FIG. 5 shows an outline of the external magnetic field detection operation using the Hall element 10. The external magnetic field detection operation is executed by the switch circuit 20, the magnetic field detection circuit 30, and the drive source 50 under the control of the control circuit 70. The external magnetic field detection operation includes an operation in a first detection section and an operation in a second detection section. The first detection section and the second detection section are sections separated from each other. In the example of FIG. 5, the second detection section is set after the first detection section. However, the first detection section may be set after the second detection section.

In the first detection section, the drive state of the Hall element 10 is set to the first drive state by the function of the switch circuit 20. The magnitude of the Hall voltage generated in the Hall element 10 when the external magnetic field acts on the Hall element 10 is particularly represented by a symbol "$S_{EXTERNAL}$". Then, in the first detection section, "$V_{HL}=V_1=S_{EXTERNAL}$ $V_{OFFSET}$". In the second detection section, the drive state of the Hall element 10 is set to the second drive state by the function of the switch circuit 20. Then, in the second detection section, "$V_{HL}=V_2=-S_{EXTERNAL}+V_{OFFSET}$".

In the external magnetic field detection operation using the Hall element 10, the magnetic field detection circuit 30 detects a difference voltage $V_{DEF\_DET}$ between the voltage $V_{HL}$ (i.e., $V_1$) in the first detection section and the voltage $V_{HL}$ (i.e., $V_2$) in the second detection section. The difference voltage $V_{DEF\_DET}$ is represented by the following equation (b1). Since the Hall voltage $S_{EXTERNAL}$ based on the external magnetic field is proportional to the external magnetic field, the external magnetic field is detected by the detection of the differential voltage $V_{DEF\_DET}$.

$$V_{DEF\_DET} = \\ (S_{EXTERNAL}+V_{OFFSET})-(-S_{EXTERNAL}+V_{OFFSET})=2S_{EXTERNAL} \tag{b1}$$

The magnetic field detection circuit 30 includes an amplifier circuit, a sample hold circuit, and the like. In the external magnetic field detection operation, the magnetic field detection circuit 30 generates and outputs a signal corresponding to the difference voltage $V_{DEF\_DET}$ as a signal indicating the detection result of the external magnetic field. The output circuit 40 outputs a signal based on the output signal of the magnetic field detection circuit 30 to a host system (not shown) installed outside the magnetic sensor 1. The control circuit 70 controls the switch circuit 20, the magnetic field detection circuit 30, the output circuit 40, the drive source 50, and the test magnetic field generation circuit 60.

By the way, the magnetic field detection circuit 30 can perform a test operation in cooperation with the test magnetic field generation circuit 60 under the control of the control circuit 70. The test operation is a process for detecting the presence or absence of an abnormality in the magnetic sensor 1 (specifically, an abnormality in the Hall element 10, the switch circuit 20, the magnetic field detection circuit 30, or the drive source 50) and is also referred to as a self-test.

Figure 6:
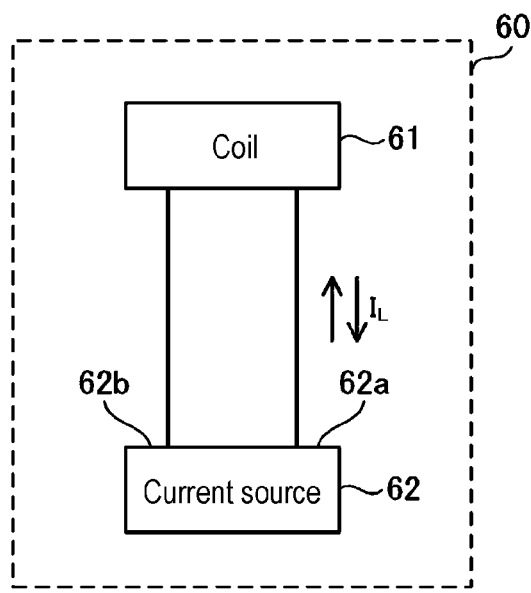
FIG. 6 is a configuration diagram of a test magnetic field generation circuit according to the first embodiment of the present disclosure.

As shown in FIG. 6, the test magnetic field generation circuit 60 includes a coil 61 and a current source 62. The current source 62 supplies a current for generating a test magnetic field (hereinafter referred to as coil current $I_L$) to the coil 61. The coil 61 receives the coil current $I_L$ to generate a test magnetic field. That is, the test magnetic field is generated by the coil 61 when the coil current $I_L$ flows through the coil 61. The test magnetic field contains a magnetic field component in the Z-axis direction. The current source 62 includes a switching circuit and can switch the direction of the coil current $I_L$. It may also be considered that a switching circuit is interposed between the current source 62 and the coil 61.

Figure 7:
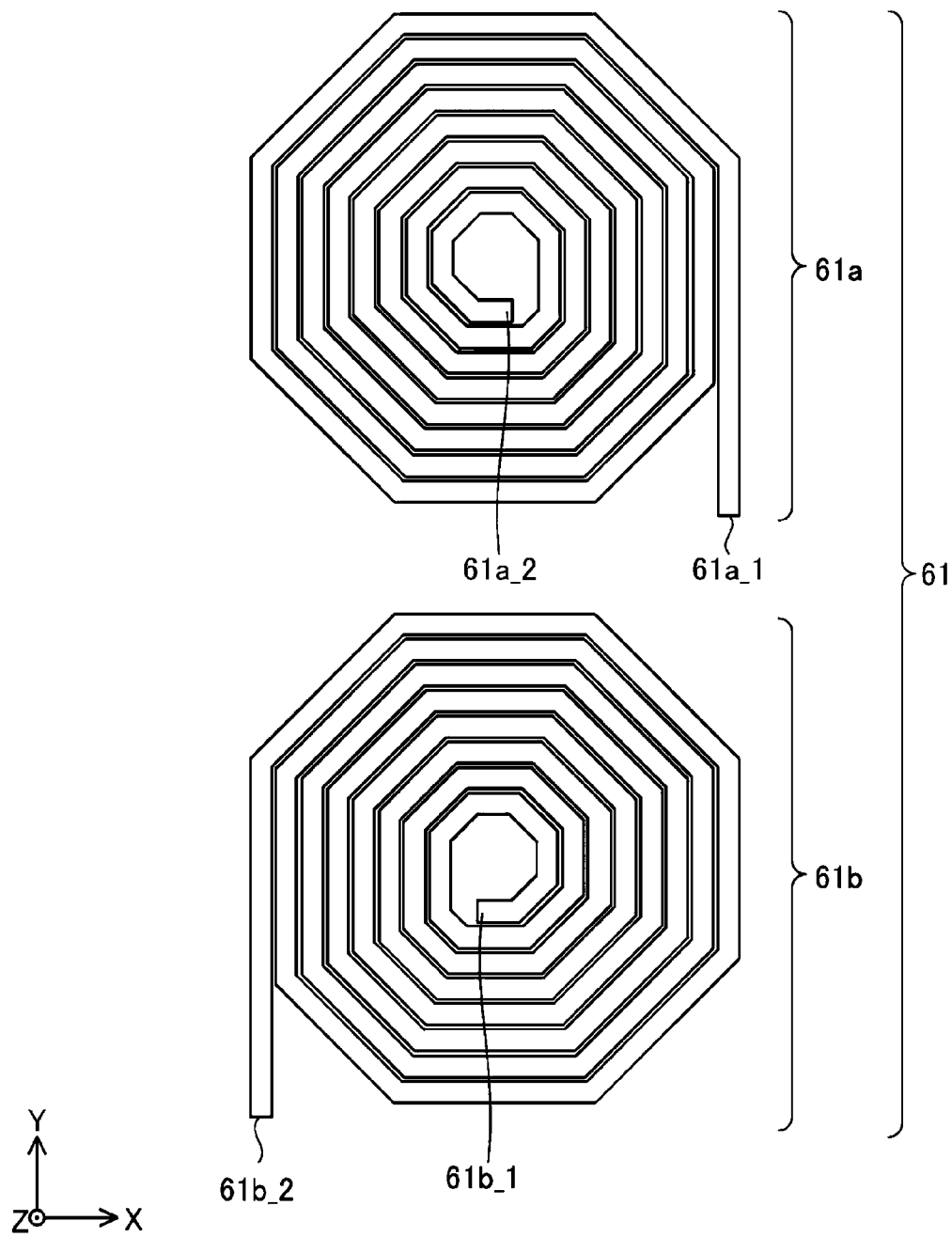
FIG. 7 is an exploded plan view of a test magnetic field generation coil according to the first embodiment of the present disclosure.
Figure 8:
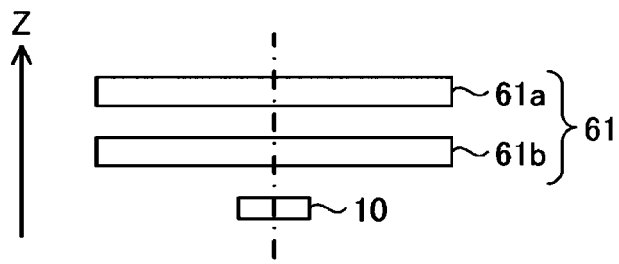
FIG. 8 is a diagram showing a positional relationship between the test magnetic field generation coil and the Hall element according to the first embodiment of the present disclosure.

The structure of the coil 61 will be described with reference to FIGS. 7 and 8. The coil 61 is a coil wound around the Z axis. In the example of FIGS. 7 and 8, the coil 61 is configured by the coil portions 61a and 61b. In FIG. 7, the coil portions 61a and 61b are shown side by side for the sake of convenience. However, in reality, when the coil 61 is observed along the Z-axis direction, the coil portions 61a and 61b overlap with each other. A plurality of layers is installed on the semiconductor substrate constituting the magnetic sensor 1. Among the plurality of layers, the coil portion 61a is installed in a first layer, the coil portion 61b is installed in a second layer, and the Hall element 10 is installed in a third layer. The first to third layers are different layers arranged along the Z-axis direction, but they may not be adjacent to each other.

The coil portions 61a and 61b are coils having a common central axis parallel to the Z axis. A first end 61a_1 of the coil portion 61a is connected to a first output end 62a (see FIG. 6) of the current source 62, and a second end 61a_2 of the coil portion 61a is connected to the first end 61b_1 of the coil portion 61b through a via between the first layer and the second layer. A second end 61b_2 of the coil portion 61b is connected to a second output end 62b (see FIG. 6) of the current source 62. The current source 62 can supply the coil current $I_L$ to the coil 61 in a third direction or a fourth direction. The third direction is a direction extending from the first output end 62a toward the second output end 62b through the coil 61, and the fourth direction is a direction extending from the second output end 62b toward the first output end 62a through the coil 61. That is, the third direction and the fourth direction are opposite to each other. The direction of the test magnetic field when the coil current $I_L$ flows in the third direction and the direction of the test magnetic field when the coil current $I_L$ flows in the fourth direction are opposite to each other.

As shown in FIG. 8, the center of the Hall element 10 is located, for example, on the central axis of the coil portions 61a and 61b. However, the position of the center of the Hall element 10 may be slightly deviated from the central axis. The magnetic force lines of the test magnetic field generated by supplying the coil current $I_L$ to the coil 61 pass inside the Hall element 10 along the Z axis. Therefore, when the test magnetic field is generated, a Hall voltage corresponding to the test magnetic field is generated in the Hall element 10. The structure of the coil 61 may be arbitrary as long as the coil 61 has a structure capable of generating a test magnetic field in the Z-axis direction and causing the test magnetic field to act on the Hall element 10.

Hereinafter, it is assumed that the polarity of the coil current $I_L$ in the third direction is positive, and the polarity of the coil current $I_L$ in the fourth direction is negative.

Figure 9:
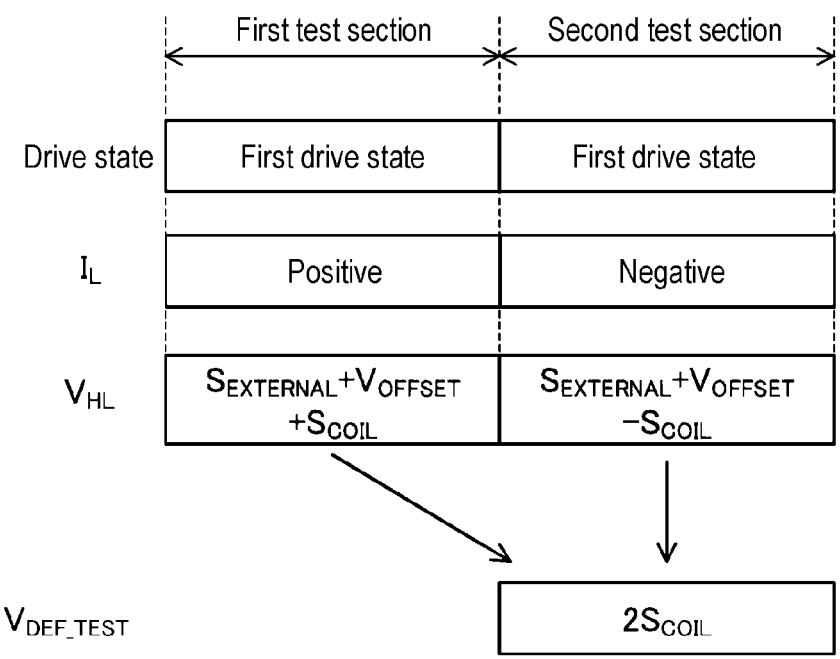
FIG. 9 is an explanatory diagram of a test operation according to the first embodiment of the present disclosure.

FIG. 9 shows an outline of a test operation using the Hall element 10. The test operation is performed by the switch circuit 20, the magnetic field detection circuit 30, the drive source 50, and the test magnetic field generation circuit 60 under the control of the control circuit 70. The test operation includes an operation during a first test section and an operation during a second test section. The first test section and the second test section are sections separated from each other. In the example of FIG. 9, the second test section is set after the first test section. However, the first test section may be set after the second test section.

In both the first and second test sections, the drive state of the Hall element 10 is set to the first drive state by the function of the switch circuit 20. In the first test section, a positive coil current $I_L$ is supplied to the coil 61, and in the second test section, a negative coil current $I_L$ is supplied to the coil 61. Therefore, the directions of the test magnetic fields acting on the Hall element 10 are opposite in the first test section and the second test section. Therefore, in the first test section, "$V_{HL}=S_{EXTERNAL}+V_{OFFSET}+S_{COIL}$", while in the second test section, "$V_{HL}=S_{EXTERNAL}+V_{OFFSET}-S_{COIL}$". In this regard, $S_{COIL}$ represents the magnitude of the Hall voltage generated in the Hall element 10 by the test magnetic field acting on the Hall element 10. As seen from the state of "$I_L=0$", it is assumed that when the positive coil current $I_L$ is supplied to the coil 61, the voltage $V_{HL}$ changes in the direction in which the voltage $S_{COIL}$ increases, and when the negative coil current $I_L$ is supplied to the coil 61, the voltage $V_{HL}$ changes in the direction in which the voltage $S_{COIL}$ decreases.

In the test operation using the Hall element 10, the magnetic field detection circuit 30 detects a difference voltage $V_{DEF\_TEST}$ between the voltage $V_{HL}$ in the first test section and the voltage $V_{HL}$ in the second test section. The difference voltage $V_{DEF\_TEST}$ is represented by the following equation (b2). Since the drive current $I_{DRV}$ in a common direction is supplied to the Hall element 10 in the first and second test sections, the component of the external magnetic field is not included in the difference voltage $V_{DEF\_TEST}$, and the offset component ($V_{OFFSET}$) is also canceled. Therefore, only the component of the test magnetic field ($2S_{COIL}$) is included in the difference voltage $V_{DEF\_TEST}$.

$$V_{DEF\_TEST} = (S_{EXTERNAL} + V_{OFFSET} + S_{COIL}) - \\ (S_{EXTERNAL} + V_{OFFSET} - S_{COIL}) = 2S_{COIL} \quad (b2)$$

It is possible to determine whether the magnetic sensor 1 is in a normally operable state (i.e., it is possible to perform a self-test) by performing the test operation and detecting the difference voltage $V_{DEF\_TEST}$.

The drive state of the Hall element 10 may be set to the second drive state in both the first and second test sections. The coil current $I_L$ is supplied to the coil 61 only during the period in which the test operation is performed (i.e., only in the first and second test sections). Therefore, when the external magnetic field detection operation is performed (hence, in the first and second detection sections), the coil current $I_L$ is zero. The first embodiment includes the following Examples EX1_A to EX1_D. Examples EX1_A to EX1_D may be arbitrarily combined as long as there is no contradiction.

Example EX1_A

Figure 10:
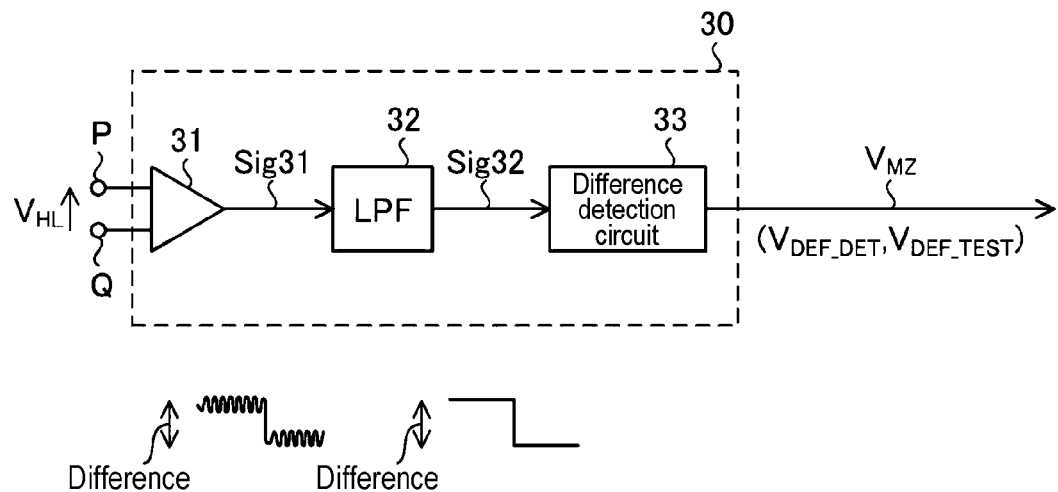
FIG. 10 is a configuration diagram of a magnetic field detection circuit according to the first embodiment of the present disclosure.

Example EX1_A will be described. FIG. 10 shows a configuration of the magnetic field detection circuit 30 according to Example EX1_A. The magnetic field detection circuit 30 of FIG. 10 includes an amplifier 31, an LPF 32 which is a low-pass filter, and a difference detection circuit 33.

The amplifier 31 amplifies the voltage $V_{HL}$ applied between the above-mentioned nodes P and Q, and outputs an amplified $V_{HL}$ as a signal Sig31. The amplifier 31 may be configured by a chopper amplifier or the like.

The LPF 32 applies a low frequency passing process to the signal Sig31 that attenuates a relatively high frequency component in the signal Sig31 and passes a relatively low frequency component in the signal Sig31, and outputs the signal Sig31 subjected to the low frequency passing process as a signal Sig32. Thus, as compared with the signal Sig31, a signal component in a band above a predetermined cutoff frequency is reduced in the signal Sig32.

The difference detection circuit 33 includes a sample/hold circuit or the like, and outputs a magnetic field detection voltage $V_{MZ}$ based on the signal Sig32.

The operation of the magnetic field detection circuit 30 in the external magnetic field detection operation will be described. In the external magnetic field detection operation, in the first detection section, the amplified signal Sig31 of the voltage $V_{HL}$ (see FIG. 5) in the first detection section is inputted to the difference detection circuit 33 as the signal Sig32 through the LPF 32, and the difference detection circuit 33 holds the voltage value of the signal Sig32 in the first detection section. Then, in the second detection section, the amplified signal Sig31 of the voltage $V_{HL}$ (see FIG. 5) in the second detection section is inputted to the difference detection circuit 33 as the signal Sig32 through the LPF 32. The difference detection circuit 33 generates and outputs a magnetic field detection voltage $V_{MZ}$ having a difference value between the voltage value of the signal Sig32 in the first detection section and the voltage value of the signal Sig32 in the second detection section (specifically, for example, a voltage value obtained by subtracting the latter voltage value from the former voltage value). The magnetic field detection voltage $V_{MZ}$ generated and outputted in the external magnetic field detection operation indicates the detection result of the above-mentioned difference voltage $V_{DEF\_DET}$, has a voltage value proportional to the difference voltage $V_{DEF\_DET}$ (see equation (b1) and FIG. 5), and functions as a signal indicating the detection result of the external magnetic field (external magnetic field detection result signal). The magnetic field detection voltage $V_{MZ}$ generated and outputted in the external magnetic field detection operation indicates at least the magnitude of the external magnetic field in the Z-axis direction and may also indicate the polarity of the external magnetic field in the Z-axis direction (whether the external magnetic field in the Z-axis direction is in the positive direction or the negative direction).

The operation of the magnetic field detection circuit 30 in the test operation will be described. In the test operation, in the first test section, the amplified signal Sig31 of the voltage $V_{HL}$ (see FIG. 9) in the first test section is inputted to the difference detection circuit 33 as a signal Sig32 through the LPF 32, and the difference detection circuit 33 holds the voltage value of the signal Sig32 in the first test section. Then, in the second test section, the amplified signal Sig31 of the voltage $V_{HL}$ (see FIG. 9) in the second test section is inputted to the difference detection circuit 33 as a signal Sig32 through the LPF 32. The difference detection circuit 33 generates and outputs a magnetic field detection voltage $V_{MZ}$ having a difference value between the voltage value of the signal Sig32 in the first test section and the voltage value of the signal Sig32 in the second test section (specifically, for example, a voltage value obtained by subtracting the latter voltage value from the former voltage value). The magnetic field detection voltage $V_{MZ}$ generated and outputted in the test operation indicates the detection result of the above-mentioned difference voltage $V_{DEF\_TEST}$ and has a voltage value proportional to the difference voltage $V_{DEF\_TEST}$ (see equation (b2) and FIG. 9). The magnetic field detection voltage $V_{MZ}$ generated and outputted in the test operation functions as a test result signal indicating the result of the response to the application of the test magnetic field. The test result signal corresponds to the Z-axis direction test result signal in the third embodiment described later.

When the external magnetic field contains an AC component during the execution period of the test operation, the difference voltage $V_{DEF\_TEST}$ may contain a component derived from the AC component. However, the AC component can be removed by the LPF 32. The cutoff frequency of the LPF 32 is sufficiently higher than a frequency represented by the reciprocal of the sum of the lengths of the first and second detection sections and is sufficiently higher than a frequency represented by the reciprocal of the sum of the lengths of the first and second test sections. In other words, a time constant of LPF 32 is sufficiently longer than the sum of the lengths of the first and second detection sections and is sufficiently longer than the sum of the lengths of the first and second test sections. Therefore, the presence of the LPF 32 does not prevent detection of the difference voltages $V_{DEF\_DET}$ and $V_{DEF\_TEST}$ as represented by the above equations (b1) and (b2).

The LPF 32 may be removed from the magnetic field detection circuit 30. In this case, the signal Sig31 and the signal Sig32 refer to the same thing.

Example EX1_B

Figure 11:
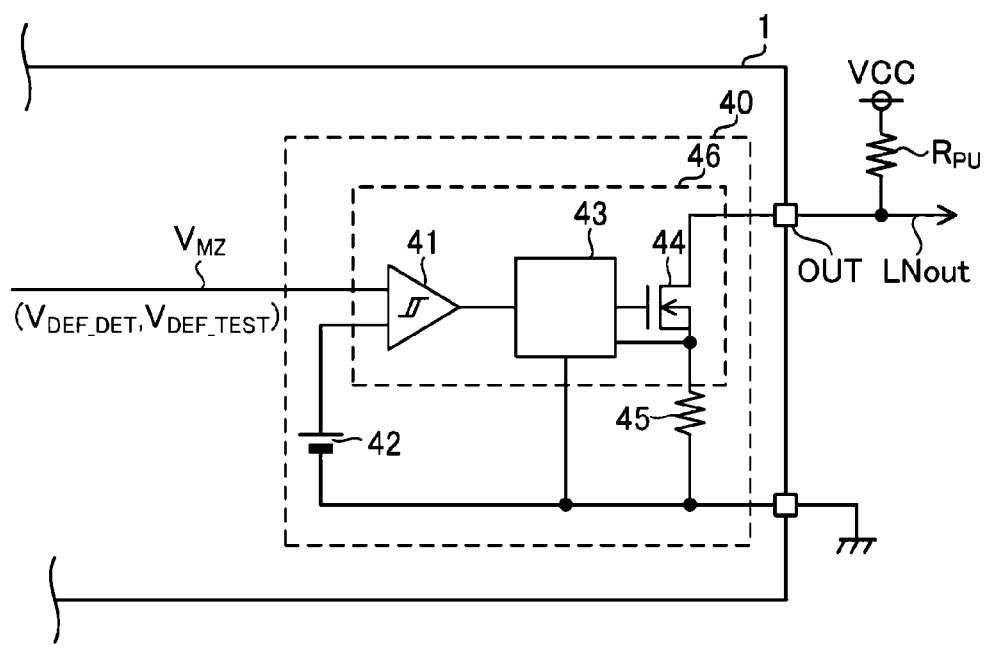
FIG. 11 is a configuration diagram of an output circuit according to the first embodiment of the present disclosure.

Example EX1_B will be described. FIG. 11 shows a configuration of the output circuit 40 according to Example EX1_B. The output circuit 40 of FIG. 11 includes a comparator 41, a reference voltage source 42, a gate driver 43, a transistor 44 configured as an N-channel MOSFET (Metal-Oxide-Semiconductor Field-Effect Transistor), and a protection resistor 45.

A drain of the transistor 44 is connected to a terminal OUT, which is one of the external terminals installed in the magnetic sensor 1. The terminal OUT is connected to a wiring LNout outside the magnetic sensor 1. Outside the magnetic sensor 1, the wiring LNout is connected to a terminal to which a predetermined positive DC voltage VCC is applied via a pull-up resistor $R_{PU}$. A source of the transistor 44 is connected to ground via the protection resistor 45.

The comparator 41 compares the magnetic field detection voltage $V_{MZ}$ from the magnetic field detection circuit 30 with the reference voltage outputted by the reference voltage source 42 and outputs a high-level signal when the magnetic field detection voltage $V_{MZ}$ is higher than the reference voltage. Otherwise, the comparator 41 outputs a low-level signal. The magnetic field detection voltage $V_{MZ}$ has a zero or positive voltage value. A hysteresis characteristic may be given to the comparison operation of the comparator 41.

The operation mode of the magnetic sensor 1 includes a normal mode in which only the external magnetic field detection operation is performed and a test mode in which only the test operation is performed. The magnetic sensor 1 operates in the normal mode or the test mode.

In the normal mode, the gate driver 43 sets the transistor 44 as an on state (conduction state) when the high-level signal is outputted from the comparator 41 and sets the transistor 44 as an off state (cutoff state) when the low-level signal is outputted from the comparator 41. However, the gate driver 43 switches the transistor 44 to the off state when the voltage drop of the protection resistor 45 becomes equal to or higher than a predetermined protection voltage while the transistor 44 is controlled to be in the on state. When the transistor 44 is turned off, a potential of the wiring LNout is maintained at a high level (a level of the DC voltage VCC), and when the transistor 44 is turned on, the potential of the wiring LNout is dropped to a low level (substantially ground level). In the normal mode, the host system (not shown) installed outside the magnetic sensor 1 can recognize the presence or absence of an external magnetic field by monitoring the potential of the wiring LNout.

In the test mode, the comparator 41 compares the magnetic field detection voltage $V_{MZ}$ (i.e., the voltage proportional to the difference voltage $V_{DEF\_TEST}$) as the test result signal with the reference voltage and when the former is lower than the latter, the output circuit 40 determines that there is an abnormality. When the output circuit 40 determines that there is an abnormality, a predetermined abnormality signal is outputted from the output circuit 40. The abnormality signal is a signal indicating that the magnetic sensor 1 has an abnormality. In the configuration of FIG. 11, the operation of fixing the transistor 44 to an off state by the gate driver 43 corresponds to the output of the abnormality signal. The host system (not shown) installed outside the magnetic sensor 1 recognizes the occurrence of an abnormality in the magnetic sensor 1 by detecting that the potential of the wiring LNout is fixed to a high level (the level of the DC voltage VCC). The abnormality signal may be outputted even when the magnetic sensor 1 detects a high-temperature abnormality or the like.

The output circuit 40 includes an abnormality signal output circuit 46 that outputs a predetermined abnormality signal when the test result signal satisfies a predetermined abnormality determination condition. In the configuration of FIG. 11, the abnormality signal output circuit 46 includes a comparator 41, a gate driver 43, and a transistor 44 as components. The abnormality signal output circuit 46 may also include the reference voltage source 42 and the protection resistor 45. When the magnetic field detection voltage $V_{MZ}$ (i.e., the voltage proportional to the difference voltage $V_{DEF\_TEST}$) as the test result signal is lower than the reference voltage in the test mode, the predetermined abnormality determination condition is satisfied. Alternatively, the output circuit 40 may be configured so that the predetermined abnormality determination condition is satisfied when the magnetic field detection voltage $V_{MZ}$ (i.e., the voltage proportional to the difference voltage $V_{DEF\_TEST}$) as the test result signal deviates from a predetermined normal voltage range having upper and lower limits. The predetermined abnormality determination condition referred to herein corresponds to the Z-axis abnormality determination condition in the third embodiment described later.

Moreover, the above-mentioned form of the abnormality signal is merely an example. When it is determined that there is an abnormality, the operation of fixing the potential of the wiring LNout to the low level (substantially the ground level) may correspond to the output of the abnormality signal, or the operation of alternately and repeatedly switching the potential of the wiring LNout between a low level and a high level may correspond to the output of the abnormality signal. Further, for example, a dedicated external terminal (not shown) for outputting an abnormality signal may be provided in the magnetic sensor 1 so that when the output circuit 40 determines that there is an abnormality, the abnormality signal is transmitted to the host system (not shown) through the dedicated external terminal.

Example EX1_C

Example EX1_C will be described. In the configuration shown in Example EX1_B, the presence or absence of the external magnetic field in the normal mode is outputted to the host system (not shown) as a binarized signal. However, the output circuit 40 may output the detection result of the external magnetic field in the normal mode to the host system as a multibit digital signal or an analog signal.

That is, for example, in the normal mode, the output circuit 40 may receive a magnetic field detection voltage $V_{MZ}$ proportional to the difference voltage $V_{DEF\_DET}$ (see FIG. 5) and may output a multibit digital signal obtained by converting the magnetic field detection voltage $V_{MZ}$ to the host system (not shown). Alternatively, in the normal mode, the output circuit 40 may receive the magnetic field detection voltage $V_{MZ}$ proportional to the difference voltage $V_{DEF\_DET}$ (see FIG. 5) and may output the magnetic field detection voltage $V_{MZ}$ as an analog signal to the host system (not shown).

Example EX1_D

Example EX1_D will be described. The test operation may be executed by setting the operation mode of the magnetic sensor 1 to the test mode in the shipping process of the magnetic sensor 1. Alternatively, after the magnetic sensor 1 is activated, the test operation may be inserted and executed at predetermined intervals while repeatedly executing the external magnetic field detection operation in principle. Further, alternatively, after the magnetic sensor 1 is activated, the test operation may be executed in the test mode and then may proceed to the normal mode.

Second Embodiment

Figure 12:
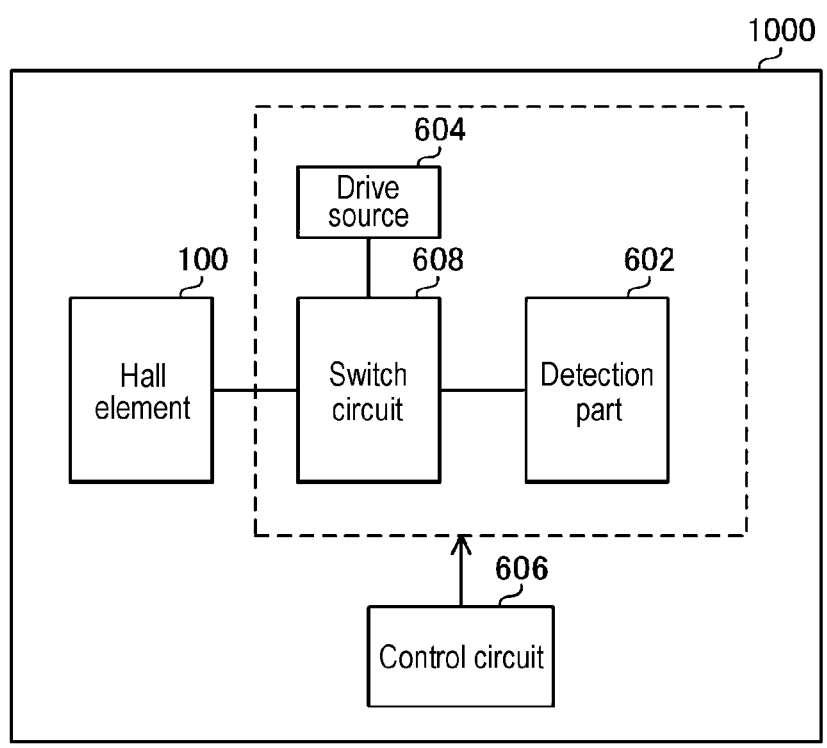
FIG. 12 is a configuration diagram of a magnetic sensor according to a second embodiment of the present disclosure.

The second embodiment of the present disclosure will be described. FIG. 12 shows a configuration example of a magnetic sensor 1000 according to a second embodiment. The magnetic sensor 1000 includes a Hall element 100, a detection part 602, a drive source 604, a control circuit 606, and a switch circuit 608. The control circuit 606 controls the detection part 602, the drive source 604, and the switch circuit 608. The Hall element 100 is a so-called vertical Hall element and detects a magnetic field by using a current flowing in a direction perpendicular to the surface of a semiconductor substrate on which the Hall element 100 is formed. The Hall element 100 outputs a Hall voltage according to the magnetic field acting on itself. The detection part 602 detects the magnetic field acting on the Hall element 100 based on the Hall voltage outputted from the Hall element 100. The drive source 604 supplies a drive current for generating a Hall voltage in the Hall element 100 to the Hall element 100 under the control of the control circuit 606.

In the Hall element 100 of the present embodiment, as described below, two sets of electrodes (a first drive electrode 101, a second drive electrode 102, a first ground electrode 151 and a second ground electrode 152, which will be described later) for supplying a drive current are arranged. As a result, Hall voltages corresponding to magnetic fields in two directions (an X-axis direction and a Y-axis direction in the present embodiment) are detected. Accordingly, the magnetic sensor 1000 can detect magnetic fields in two directions. The second drive electrode 102 may be omitted.

The second embodiment includes the following Examples EX2_A and EX2_B. Examples EX2_A and EX2_B may be arbitrarily combined as long as there is no contradiction.

Example EX2_A

Example EX2_A will be described. Example EX2_A is an example in which the switch circuit 608 of FIG. 12 is not used.

FIGS. 13 to 17 are views showing a configuration example of the Hall element 100. The schematic structure of the Hall element 100 will be described with reference to FIGS. 13 to 17. In the present embodiment, the axis in the thickness direction of the Hall element 100 is assumed to be a Z axis. The Z axis is also an axis in the normal direction to the surface 250A of a semiconductor substrate 250, which will be described later. Further, it is assumed that the X axis, the Y axis and the Z axis are orthogonal to each other. Moreover, the plane parallel to the X axis and the Y axis is referred to as an XY plane, the plane parallel to the Y axis and the Z axis is referred to as a YZ plane, and the plane parallel to the Z axis and the X axis is referred to as a ZX plane.

Figure 13:
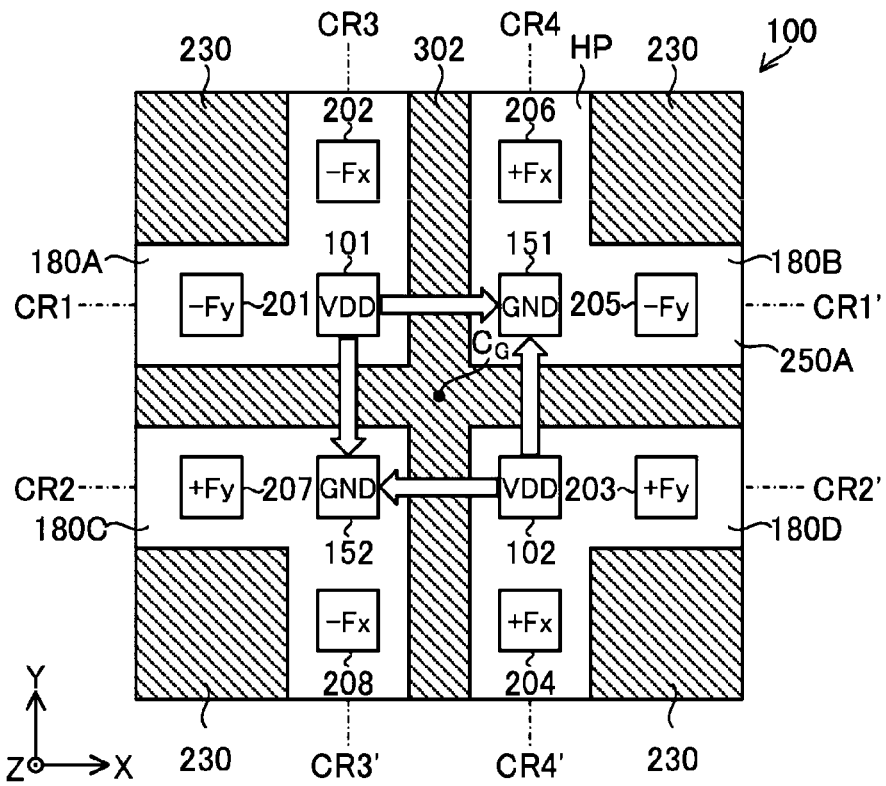
FIG. 13 is a plan view of a Hall element according to the second embodiment of the present disclosure.
Figure 14:
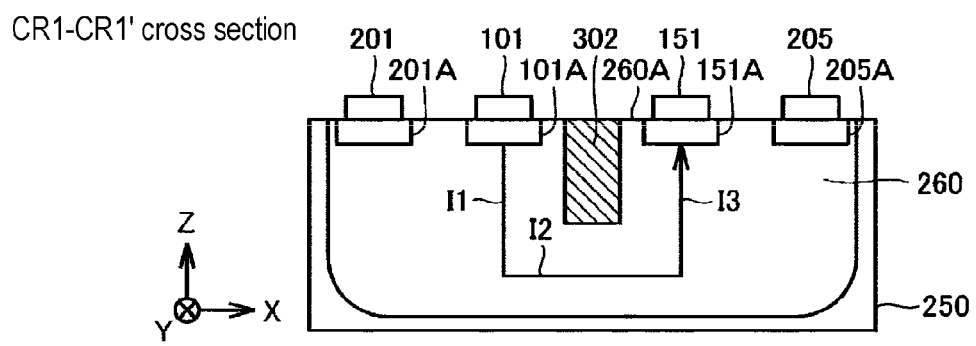
FIG. 14 is a cross-sectional view of the Hall element according to the second embodiment of the present disclosure.
Figure 15:
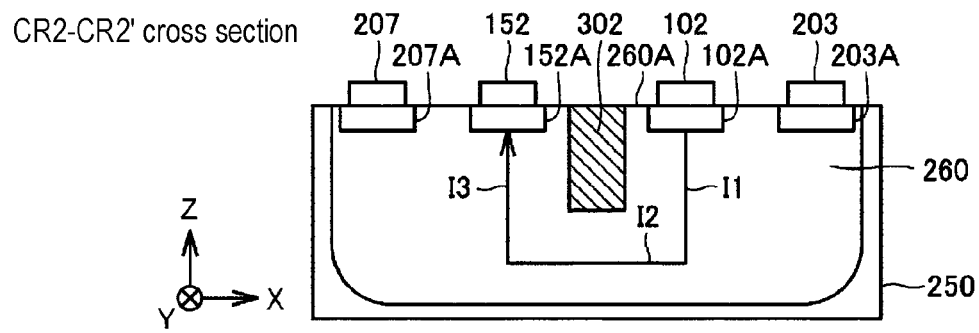
FIG. 15 is a cross-sectional view of the Hall element according to the second embodiment of the present disclosure.
Figure 16:
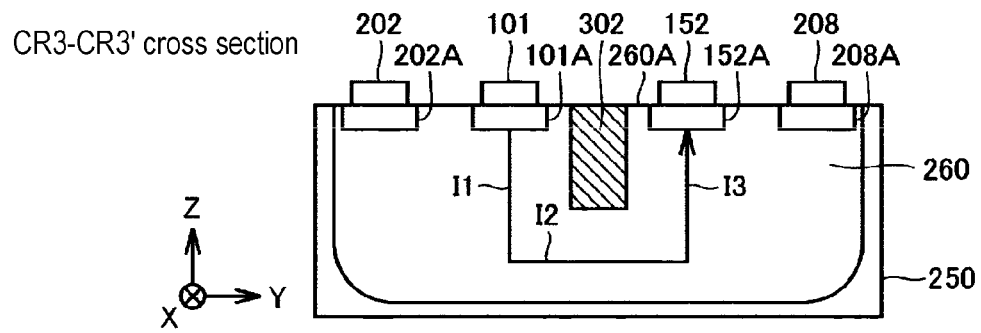
FIG. 16 is a cross-sectional view of the Hall element according to the second embodiment of the present disclosure.
Figure 17:
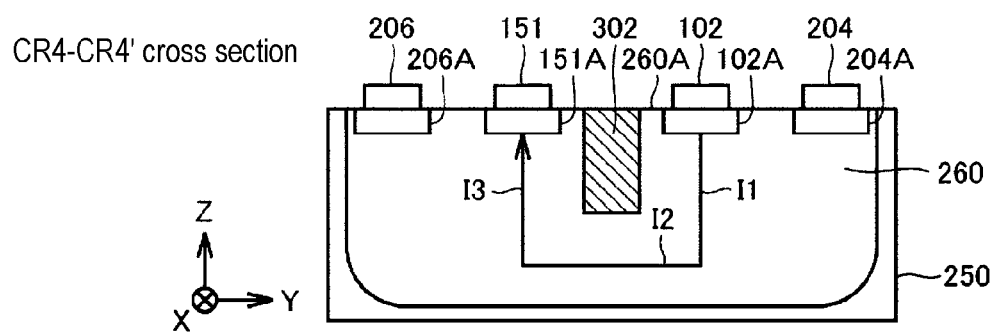
FIG. 17 is a cross-sectional view of the Hall element according to the second embodiment of the present disclosure.

FIG. 13 is a plan view of the Hall element 100 when the Hall element 100 is viewed in a plan view from the Z-axis direction. In the example of FIG. 13, the outer shape of the Hall element 100 (the outer shape of the Hall element 100 on the XY plane) is rectangular. In the present embodiment, the outer shape of the Hall element 100 is square. FIG. 14 is a cross-sectional view of the Hall element 100 taken along straight line CR1-CR1' in FIG. 13. FIG. 15 is a cross-sectional view of the Hall element 100 taken along straight line CR2-CR2' in FIG. 13. FIG. 16 is a cross-sectional view of the Hall element 100 taken along straight line CR3-CR3' in FIG. 13. FIG. 17 is a cross-sectional view of the Hall element 100 taken along straight line CR4-CR4' in FIG. 13.

As shown in FIG. 13, the Hall element 100 has a semiconductor substrate 250 (in other words, the Hall element 100 is formed on the semiconductor substrate 250). As shown in FIGS. 14 to 17, the semiconductor substrate 250 has a semiconductor region 260 (N well). The semiconductor substrate 250 is, for example, a P-type silicon substrate (P-sub). The semiconductor region 260 is formed as a diffusion layer (well) by introducing N-type conductive impurities onto the surface 250A of the semiconductor substrate 250. The semiconductor region 260 is formed so as to be surrounded by the semiconductor substrate 250.

A diffusion layer (not shown) made of a P-type semiconductor is formed on the peripheral edge of the Hall element 100 in order to separate the Hall element 100 from other elements. Further, the diffusion layer 230 made of a P-type semiconductor is formed at the four corners of the Hall element 100. The diffusion layer 230 functions as an insulating layer. As shown in FIGS. 14 to 17, in a region (active region) surrounded by the diffusion layer 230 on the surface 260A of the semiconductor region 260, twelve contact regions 101A, 102A, 151A, 152A and 201A to 208A (N+diffusion layer) are formed in such a manner that the impurity concentration (N type) on the surface is increased. Twelve electrodes (electrodes 101, 102, 151, 152 and 201 to 208 in the example of FIGS. 13 to 17) are formed for the twelve contact regions. One corresponding electrode is formed for one contact area. Good ohmic contacts are formed at the twelve contact regions and the twelve electrodes formed in the twelve contact regions.

Further, as shown in FIG. 13, the Hall element 100 is divided into four regions 180A to 180D through the p-n junction separation by the cross-shaped diffusion layer 302. The diffusion layer 302 functions as an insulating layer. The diffusion layer 302 has a diffusion depth shallower than that of the semiconductor region 260. As shown in FIGS. 14 to 17, the diffusion layer 302 forms a current passage in the semiconductor region 260. Further, in each of the four regions 180A to 180D, an electrically partitioned region is formed inside the semiconductor substrate 250. The formed region is a magnetic detection part HP (hole plate) capable of detecting a magnetic field. In the example of FIG. 13, the portion of the Hall element 100 which is not hatched is the magnetic detection part.

When the Hall element 100 is viewed in a plan view from the Z-axis direction, two of the four sides of the square as the external shape of the Hall element 100 are parallel to the X axis, and the remaining two sides are parallel to the Y axis. It is assumed that the direction from the region 180A to the region 180B is the positive direction of the X axis, and the direction from the region 180C to the region 180A is the positive direction of the Y axis.

Twelve electrodes 101, 102, 151, 152 and 201 to 208 will be described. In Example EX2_A, the electrodes 101 and 102 function as the first and second drive electrodes, respectively, the electrodes 151 and 152 function as the first and second ground electrodes, respectively, and the electrodes 201 to 208 function as the first to eighth detection electrodes, respectively. Therefore, in Example EX2_A, the electrodes 101 and 102 may be referred to as first and second drive electrodes, respectively, the electrodes 151 and 152 may be referred to as first and second ground electrodes, respectively, and the electrodes 201 to 208 may be referred to as first to eighth detection electrodes, respectively. In addition, the first to eighth detection electrodes 201 to 208 may be collectively referred to as a detection electrode group.

The first drive electrode 101 and the second drive electrode 102 are electrodes to which a drive current from the drive source 604 is supplied under the control of the control circuit 606. The first ground electrode 151 and the second ground electrode 152 are electrodes having a ground potential. Each detection electrode is an electrode for detecting the Hall voltage generated by the magnetic field acting on the Hall element 100.

In the drawing (e.g., FIG. 13) showing the Hall element referred to in the second embodiment and other embodiments described later, the symbol "VDD" is attached to the electrode to which the power supply voltage VDD is to be applied, and the symbol "GND" is attached to the electrode having a ground potential. Further, +Fx indicates that a positive Hall voltage corresponding to the magnetic field in the X-axis direction is detected. −Fx indicates that a negative Hall voltage corresponding to the magnetic field in the X-axis direction is detected. +Fy indicates that a positive Hall voltage corresponding to the magnetic field in the Y-axis direction is detected. −Fy indicates that a negative Hall voltage corresponding to the magnetic field in the Y-axis direction is detected. In the second embodiment, the positive Hall voltage is a voltage in which the direction of the Lorentz force corresponding to the Hall voltage is toward the detection electrode for detecting the Hall voltage. The negative Hall voltage is a voltage in which the direction of the Lorentz force corresponding to the Hall voltage is away from the detection electrode for detecting the Hall voltage. Further, in the drawing (e.g., FIG. 13) showing the Hall element referred to in the second embodiment and other embodiments described later, a thick arrow indicates a flow of the drive current.

The electrodes 101, 201 and 202 are formed in the region 180A. The electrodes 151, 205 and 206 are formed in the region 180B. The electrodes 152, 207 and 208 are formed in the region 180C. The electrodes 102, 203 and 204 are formed in the region 180D. Further, the electrodes 101 and 102, the electrodes 151 and 152, the electrodes 201 and 203, the electrodes 202 and 204, the electrodes 205 and 207, and the electrodes 206 and 208 are each in a point-symmetrical positional relationship with respect to the center of gravity $C_G$ of the Hall element 100.

The electrode 151 is arranged apart from the electrode 101 in the positive direction of the X axis. The electrode 152 is arranged apart from the electrode 101 in the negative direction of the Y axis. The electrode 102 is arranged apart from the electrode 151 in the negative direction of the Y axis and apart from the electrode 152 in the positive direction of the X axis.

The electrode 201 is arranged apart from the electrode 101 in the negative direction of the X-axis. The electrodes 202 is arranged apart from the electrode 101 in the positive direction of the Y axis. The electrode 203 is arranged apart from the electrode 102 in the positive direction of the X axis. The electrode 204 is arranged apart from the electrode 102 in the negative direction of the Y axis. The electrode 205 is arranged apart from the electrode 151 in the positive direction of the X axis. The electrode 206 is arranged apart from the electrode 151 in the positive direction of the Y axis. The electrode 207 is arranged apart from the electrode 152 in the negative direction of the X-axis. The electrode 208 is arranged apart from the electrode 152 in the negative direction of the Y axis.

Figure 18:
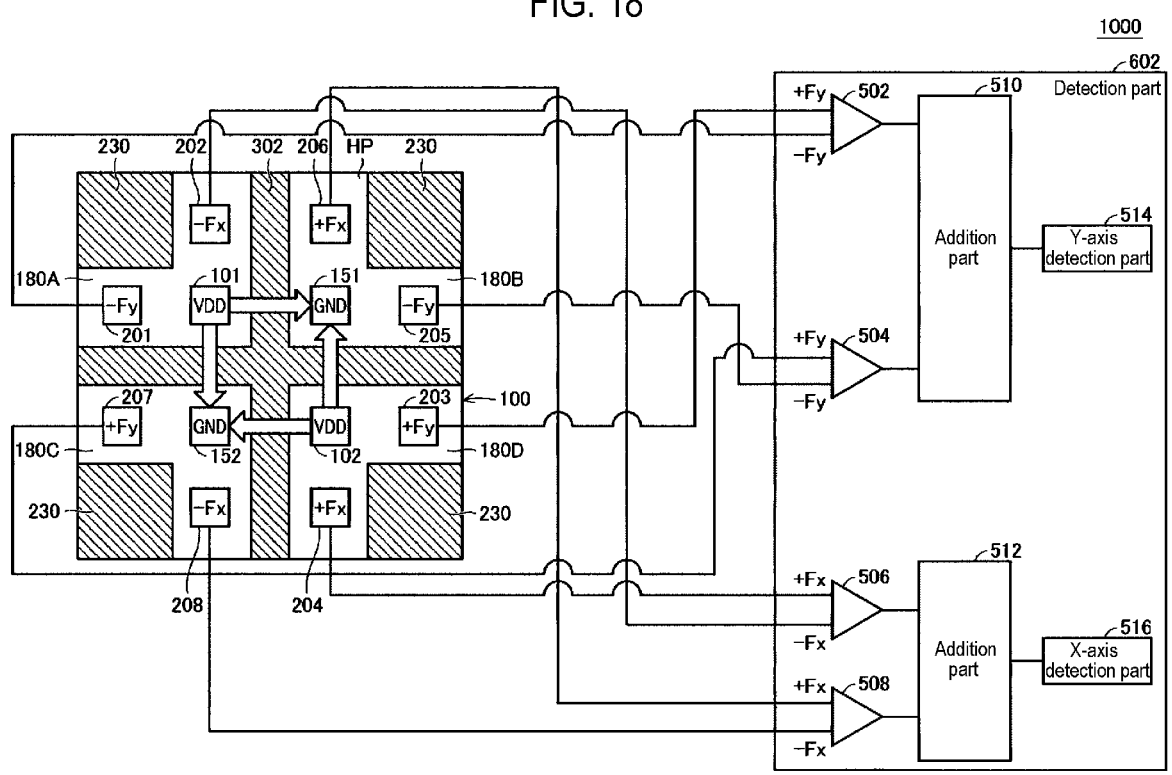
FIG. 18 is a diagram showing a connection relationship between the Hall element and the detection part and an internal configuration of the detection part according to the second embodiment of the present disclosure.

FIG. 18 is a diagram for explaining a connection relationship of the wiring between the Hall element 100 and the detection part 602. As described above, it is assumed that the switch circuit 608 (see FIG. 12) is not used in the EX2_A embodiment, and it is interpreted that the switch circuit 608 does not exist. The detection part 602 of FIG. 18 includes amplifiers 502, 504, 506 and 508, addition parts 510 and 512, a Y-axis detection part 514, and an X-axis detection part 516.

In Example EX2_A, the electrodes 201 to 208 function as the first to eighth detection electrodes. Then, the first detection electrode 201 and the third detection electrode 203 are connected to the amplifier 502. The fifth detection electrode 205 and the seventh detection electrode 207 are connected to the amplifier 504. The second detection electrode 202 and the fourth detection electrode 204 are connected to the amplifier 506. The sixth detection electrode 206 and the eighth detection electrode 208 are connected to the amplifier 508.

As shown in FIGS. 14 and 16, when a drive current is supplied to the first drive electrode 101, the drive current flows from the first drive electrode 101 to the first ground electrode 151 and the second ground electrode 152. In the present embodiment, the diffusion layer 302 is formed in the negative direction of the Z axis between the first drive electrode 101 and the first ground electrode 151, and between the first drive electrode 101 and the second ground electrode 152. Therefore, as a drive current path, a path I1 extending in the negative direction of the Z axis, a path I2 parallel to the XY plane, and a path I3 extending in the positive direction of the Z axis are formed. The drive current from the first drive electrode 101 to the first ground electrode 151 and the second ground electrode 152 flows in the order of the path I1, the path I2, and the path I3.

As shown in FIGS. 15 and 17, when a drive current is supplied to the second drive electrode 102, the drive current flows from the second drive electrode 102 to the first ground electrode 151 and the second ground electrode 152. In the present embodiment, the diffusion layer 302 is formed in the negative direction of the Z axis between the second drive electrode 102 and the first ground electrode 151, and between the second drive electrode 102 and the second ground electrode 152. Therefore, as a drive current path, a path I1 extending in the negative direction of the Z axis, a path I2 parallel to the XY plane, and a path I3 extending in the positive direction of the Z axis are formed. The drive current from the second drive electrode 102 to the first ground electrode 151 and the second ground electrode 152 flows in the order of the path I1, the path I2, and the path I3.

Referring to FIG. 14, when a magnetic field acting in the positive direction of the Y axis is applied to the Hall element 100, a negative Hall voltage (−Fy) is detected at the first detection electrode 201 due to the Hall effect based on the magnetic field in the positive direction of the Y axis and the drive current in the path I1. Further, when a magnetic field acting in the positive direction of the Y axis is applied to the Hall element 100, a negative Hall voltage (−Fy) is detected at the fifth detection electrode 205 due to the Hall effect based on the magnetic field in the positive direction of the Y axis and the drive current in the path I3.

Referring to FIG. 15, when a magnetic field acting in the positive direction of the Y axis is applied to the Hall element 100, a positive Hall voltage (+Fy) is detected at the seventh detection electrode 207 due to the Hall effect based on the magnetic field in the positive direction of the Y axis and the drive current in the path I3. Further, when a magnetic field acting in the positive direction of the Y axis is applied to the Hall element 100, a positive Hall voltage (+Fy) is detected at the third detection electrode 203 due to the Hall effect based on the magnetic field in the positive direction of the Y axis and the drive current in the path I1.

Referring to FIG. 16, when a magnetic field acting in the positive direction of the X axis is applied to the Hall element 100, a negative Hall voltage (−Fx) is detected at the second detection electrode 202 due to the Hall effect based on the magnetic field in the positive direction of the X axis and the drive current in the path I1. Further, when a magnetic field acting in the positive direction of the X axis is applied to the Hall element 100, a negative Hall voltage (−Fx) is detected at the eighth detection electrode 208 due to the Hall effect based on the magnetic field in the positive direction of the X axis and the drive current in the path I3.

Referring to FIG. 17, when a magnetic field acting in the positive direction of the X axis is applied to the Hall element 100, a positive Hall voltage (+Fx) is detected at the sixth detection electrode 206 due to the Hall effect based on the magnetic field in the positive direction of the X axis and the drive current in the path I3. Further, when a magnetic field acting in the positive direction of the X axis is applied to the Hall element 100, a positive Hall voltage (+Fx) is detected at the fourth detection electrode 204 due to the Hall effect based on the magnetic field in the positive direction of the X axis and the drive current in the path I1.

When a certain Hall voltage is detected at a certain electrode, it means that the Hall voltage is applied to the electrode. FIGS. 12 and 18 show a state when a magnetic field in the positive direction of the X axis and a magnetic field in the positive direction of the Y axis are applied to the Hall element 100.

As shown in FIG. 18, in the amplifier 502, the Hall voltage (the Hall voltage corresponding to the magnetic field in the Y-axis direction) detected by the first detection electrode 201 and the third detection electrode 203 is amplified. That is, the amplifier 502 outputs an amplified signal of the potential difference between the electrodes 203 and 201. In the amplifier 504, the Hall voltage (the Hall voltage corresponding to the magnetic field in the Y-axis direction) detected by the fifth detection electrode 205 and the seventh detection electrode 207 is amplified. That is, the amplifier 504 outputs an amplified signal of the potential difference between the electrodes 207 and 205. In the amplifier 506, the Hall voltage (the Hall voltage corresponding to the magnetic field in the X-axis direction) detected by the second detection electrode 202 and the fourth detection electrode 204 is amplified. That is, the amplifier 506 outputs an amplified signal of the potential difference between the electrodes 204 and 202. In the amplifier 508, the Hall voltage (the Hall voltage corresponding to the magnetic field in the X-axis direction) detected by the sixth detection electrode 206 and the eighth detection electrode 208 is amplified. That is, the amplifier 508 outputs an amplified signal of the potential difference between the electrodes 206 and 208.

The addition part 510 adds up the Hall voltage value amplified by the amplifier 502 (the Hall voltage value corresponding to the magnetic field in the Y-axis direction) and the Hall voltage value amplified by the amplifier 504 (the Hall voltage value corresponding to the magnetic field in the Y-axis direction). The Y-axis detection part 514 detects the magnetic field in the Y-axis direction based on the Hall voltage value added up by the addition part 510. That is, the addition part 510 outputs an added voltage representing the sum of the voltage value of the output signal of the amplifier 502 and the voltage value of the output signal of the amplifier 504, and the Y-axis detection part 514 detects a Y-axis direction magnetic field acting on the Hall element 100 based on the output voltage of the addition part 510. The addition part 510 may be omitted, and the Y-axis detection part 514 may detect a Y-axis direction magnetic field acting on the Hall element 100 based on the output signal of the amplifier 502 or 504.

The addition part 512 adds up the Hall voltage value amplified by the amplifier 506 (the Hall voltage value corresponding to the magnetic field in the X-axis direction) and the Hall voltage value amplified by the amplifier 508 (the Hall voltage value corresponding to the magnetic field in the X-axis direction). The X-axis detection part 516 detects an X-axis direction magnetic field based on the Hall voltage values added up by the addition part 512. That is, the addition part 512 outputs an added voltage representing the sum of the voltage value of the output signal of the amplifier 506 and the voltage value of the output signal of the amplifier 508 and detects an X-axis direction magnetic field acting on the Hall element 100 based on the output voltage of the addition part 512. The addition part 512 may be omitted, and the X-axis detection part 516 may detect an X-axis direction magnetic field acting on the Hall element 100 based on the output signal of the amplifier 506 or 508.

Example EX2_B

Example EX2_B will be described. As described above, each electrode in the Hall element 100 may be arranged so as to be completely symmetrical with respect to the center of gravity $C_G$ (see FIG. 13). However, the voltage detected at each detection electrode may include an offset voltage (unbalanced voltage) due to positional shift (misalignment) caused by an error. Due to the offset voltage, the magnetic field detection accuracy may decrease. The offset can be canceled for the Hall element 100 by the same principle as the method described in the first embodiment. A method of realizing the cancellation in the configuration of FIG. 18 will be described.

In order to detect the magnetic fields in the X-axis and Y-axis directions, the control circuit 606 sets first and second detection sections different from each other. Then, in the first detection section, the drive current is supplied as described in Example EX2_B, and in the subsequent second detection section, the direction of the drive current is reversed from that in the first detection section. The switch circuit 608 (see FIG. 12) is used to switch the direction of the drive current.

Figure 19:
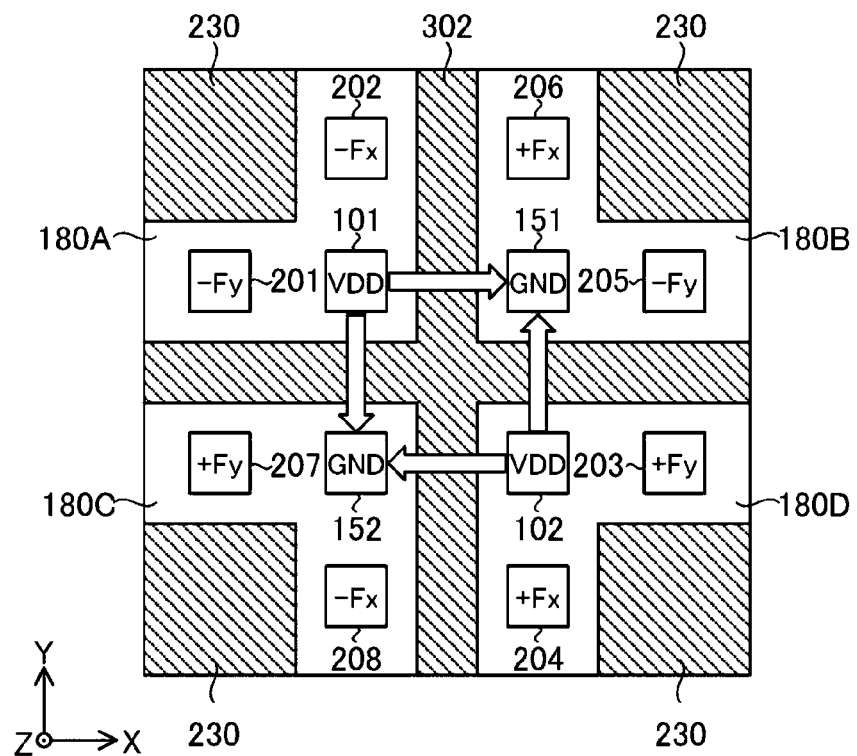
FIG. 19 is a diagram showing one drive state of the Hall element according to the second embodiment of the present disclosure.
Figure 20:
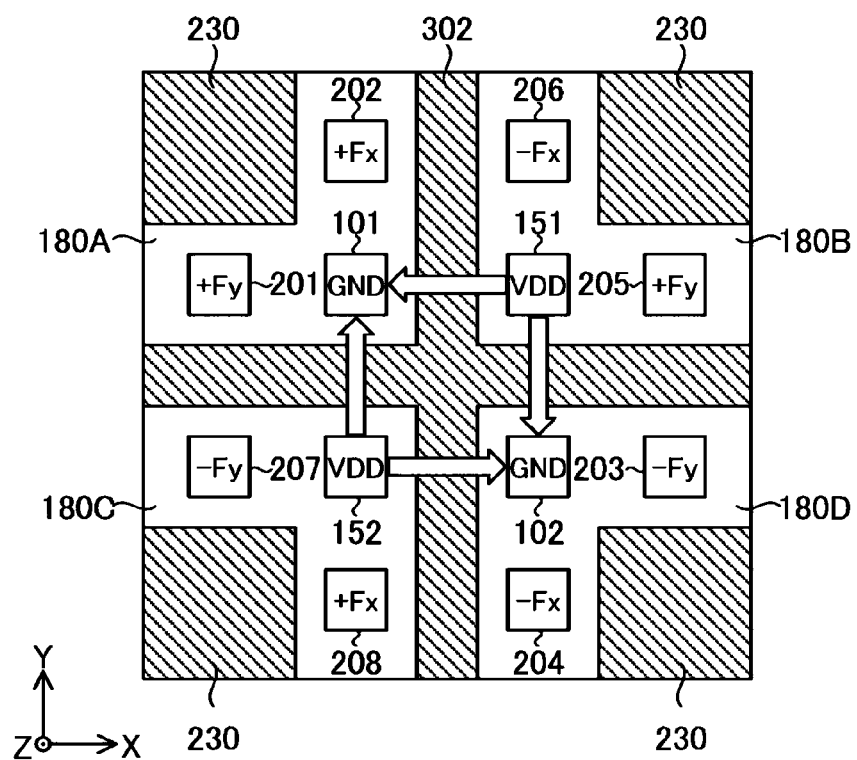
FIG. 20 is a diagram showing another drive state of the Hall element according to the second embodiment of the present disclosure.

That is, in the first detection section, as shown in FIG. 19, the drive current supply state is set to a drive state Dxy1. In the drive state Dxy1, the power supply voltage VDD is applied to the electrodes 101 and 102 while the ground potential is applied to the electrodes 151 and 152, whereby the drive current flows from the electrode 101 toward the electrodes 151 and 152 and from the electrode 102 toward the electrodes 151 and 152. In the second detection section, as shown in FIG. 20, the drive current supply state is set to a drive state Dxy2. In the drive state Dxy2, the power supply voltage VDD is applied to the electrodes 151 and 152 while the ground potential is applied to the electrodes 101 and 102, whereby the drive current flows from the electrode 151 toward the electrodes 101 and 102 and from the electrode 152 toward the electrodes 101 and 102. FIGS. 19 and 20 show a state when the magnetic field in the positive direction of the X axis and the magnetic field in the positive direction of the Y axis are applied to the Hall element 100.

The Y-axis detection part 514 has a function of holding the output voltage of the addition part 510 in the first detection section. When the output voltage of the addition part 510 in the second detection section is obtained, the Y-axis detection part 514 derives a difference voltage between the output voltage of the addition part 510 in the first detection section and the output voltage of the addition part 510 in the second detection section and detects a Y-axis direction magnetic field acting on the Hall element 100 based on the derived difference voltage. The offset is canceled at the difference voltage.

The X-axis detection part 516 has a function of holding the output voltage of the addition part 512 in the first detection section. When the output voltage of the addition part 512 in the second detection section is obtained, the X-axis detection part 516 derives a difference voltage between the output voltage of the addition part 512 in the first detection section and the output voltage of the addition part 512 in the second detection section and detects an X-axis direction magnetic field acting on the Hall element 100 based on the derived difference voltage. The offset is canceled at the difference voltage.

Third Embodiment

Figure 21:
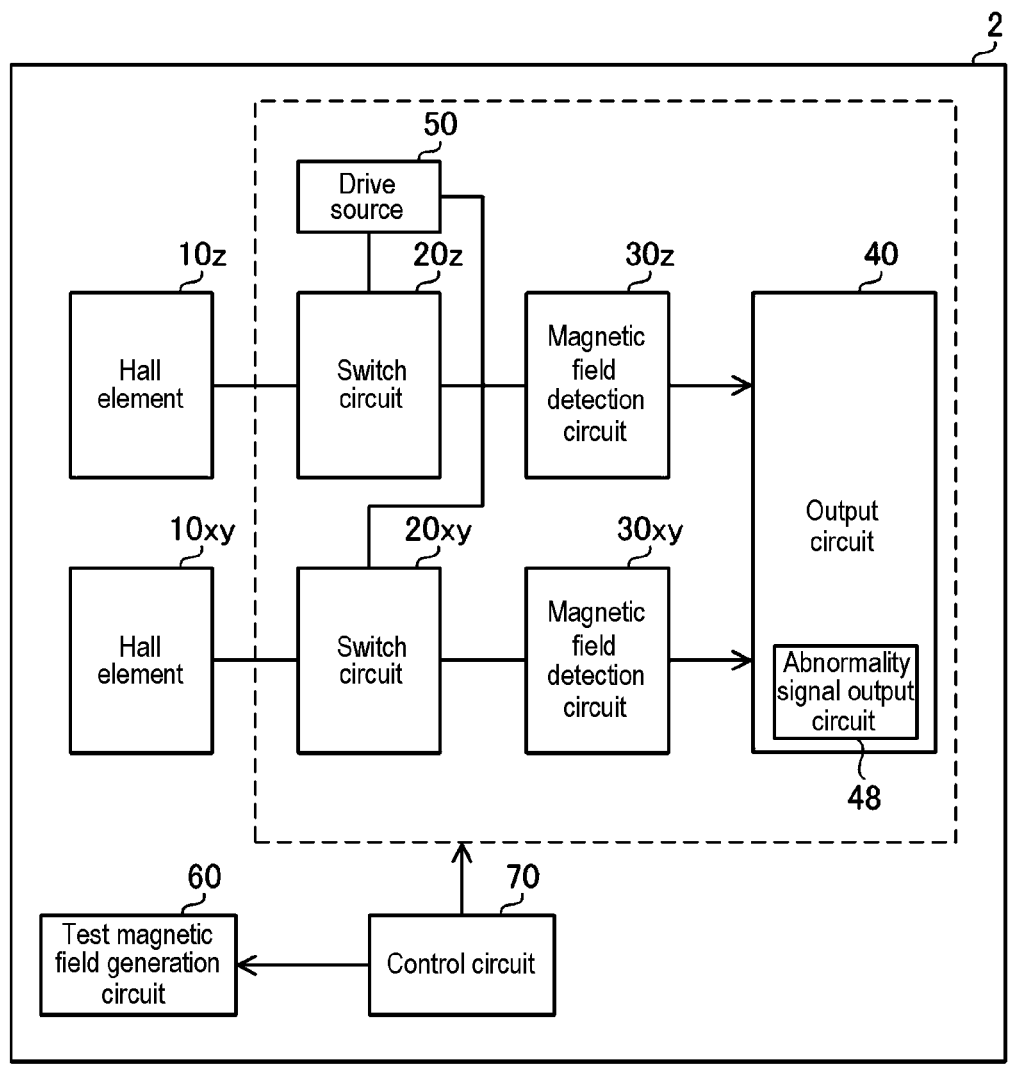
FIG. 21 is a configuration diagram of a magnetic sensor according to a third embodiment of the present disclosure.

The third embodiment of the present disclosure will be described. By combining the first and second embodiments, it is possible to provide a magnetic sensor capable of detecting magnetic fields in the three axes of the X, Y, and Z axes. FIG. 21 shows a configuration of a magnetic sensor 2 related to this combination. The magnetic sensor 2 includes a Hall element 10z, a switch circuit 20z, a magnetic field detection circuit 30z, a Hall element 10xy, a switch circuit 20xy, a magnetic field detection circuit 30xy, a drive source 50, a test magnetic field generation circuit 60, and a control circuit 70.

The Hall element 10z, the switch circuit 20z, and the magnetic field detection circuit 30z are the same as the Hall element 10, the switch circuit 20, and the magnetic field detection circuit 30 (FIG. 1) of the first embodiment. The Hall element 10xy and the switch circuit 20xy are the same as the Hall element 100 and the switch circuit 608 (see FIG. 12) of the second embodiment. The magnetic field detection circuit 30xy includes the detection part 602 (see FIG. 12) of the second embodiment. In the third embodiment, the amplifiers 502, 503, 506 and 508 shown in FIG. 18, the addition parts 510 and 512, the Y-axis detection part 514 and the X-axis detection part 516 are installed in the magnetic field detection part 30xy.

The magnetic field detection circuits 30z and 30xy can detect an external magnetic field based on the above-mentioned offset cancellation principle. The operation for detecting an external magnetic field is called an external magnetic field detection operation. The external magnetic field is a magnetic field generated outside the magnetic sensor 2 and acting on the magnetic sensor 2 from the outside of the magnetic sensor 2. The external magnetic field is a magnetic field (target magnetic field) to be detected by the magnetic sensor 2. In the external magnetic field detection operation using the Hall element 10z, which is performed by the magnetic field detection circuit 30z, the external magnetic field in the Z-axis direction can be detected. In the external magnetic field detection operation using the Hall element 10xy, which is performed by the magnetic field detection circuit 30xy, the external magnetic fields in the X-axis and Y-axis directions can be detected. In this disclosure, the external magnetic fields in the X-axis, Y-axis, and Z-axis directions have the same meaning as the X-axis, Y-axis, and Z-axis components of the external magnetic field, respectively. The definitions of the X axis, the Y axis, and the Z axis are the same as those described in the first and second embodiments. The X-axis, the Y-axis, and the Z-axis are commonly defined to the Hall elements 10z and 10xy.

The output circuit 40 according to the third embodiment includes the function of the output circuit 40 according to the first embodiment. In the present embodiment, as described in the first embodiment, it is assumed that the operation mode of the magnetic sensor 2 includes a normal mode in which only the external magnetic field detection operation is performed and a test mode in which only the test operation is performed. The magnetic sensor 2 operates in the normal mode or the test mode. In the normal mode, the output circuit 40 can output the detection result of the external magnetic field in the Z-axis direction by the magnetic field detection circuit 30z to a host system (not shown) installed outside the magnetic sensor 2 as a binarized signal, a multi-bit digital signal, or an analog signal. Further, in the normal mode, the output circuit 40 can output the detection result of the external magnetic field in the X-axis direction by the magnetic field detection circuit 30xy to the host system (not shown) as a binarized signal, a multi-bit digital signal, or an analog signal and can output the detection result of the external magnetic field in the Y-axis direction by the magnetic field detection circuit 30xy to the host system (not shown) as a binarized signal, a multi-bit digital signal, or an analog signal The drive source 50 is a power source that supplies a drive current to each of the Hall elements 10z and 10xy through the switch circuits 20z and 20xy. Specifically, the drive source 50 applies the power supply voltage VDD to the required electrodes of the Hall element 10z through the switch circuit 20z and applies the power supply voltage VDD to the required electrodes of the Hall element 10xy through the switch circuit 20xy. The drive source 50 may generate a power supply voltage VDD based on a predetermined input power supply voltage supplied to the magnetic sensor 2 from a power supply circuit (not shown) installed outside the magnetic sensor 2. Alternatively, the input power supply voltage itself may function as the power supply voltage VDD.

The switch circuit 20z switches the drive state of the Hall element 10z between the first drive state and the second drive state under the control of the control circuit 70 (see FIGS. 3 and 4). In the present embodiment, the first and second drive states as the drive states of the Hall element 10z may be referred to as drive states Dz1 and Dz2, respectively. Switching between the drive states Dz1 and Dz2 in the drive state of the Hall element 10z corresponds to switching the direction of the drive current supplied to the Hall element 10z. The details of this switching are the same as described in the first embodiment. The switch circuit 20z may be composed of a plurality of switching elements.

The switch circuit 20xy switches the driving state of the Hall element 10xy among a plurality of states under the control of the control circuit 70. Switching between a plurality of states in the drive state of the Hall element 10xy corresponds to switching the direction of the driving current supplied to the Hall element 10xy. The switch circuit 20xy may be composed of a plurality of switching elements. The plurality of states includes the drive states Dxy1 and Dxy2 shown in FIGS. 19 and 20. The drive state of the Hall element 10xy may be set to a drive state other than these states. However, in the present embodiment, the drive states Dxy1 and Dxy2 are noted as the drive state of the Hall element 10xy. The Hall element 10xy is the same as the Hall element 100 of the second embodiment and, therefore, includes electrodes 101, 102, 151, 152 and 201 to 208.

The external magnetic field detection operation is subdivided into a Z-axis external magnetic field detection operation for detecting an external magnetic field in the Z-axis direction, an X-axis external magnetic field detection operation for detecting an external magnetic field in the X-axis direction, and a Y-axis external magnetic field detection operation for detecting an external magnetic field in the Y-axis direction. The Z-axis external magnetic field detection operation is the same as the external magnetic field detection operation in the first embodiment. The magnetic field detection voltage $V_{MZ}$ (see FIG. 10) generated and outputted by the Z-axis external magnetic field detection operation functions as a signal indicating the detection result of the external magnetic field in the Z-axis direction. The magnetic field detection voltage $V_{MZ}$ represents at least the magnitude of the external magnetic field in the Z-axis direction and may also represent the polarity of the external magnetic field in the Z-axis direction (whether the external magnetic field in the Z-axis direction is in the positive direction or the negative direction).

Further, if the drive states Dxy1 and Dxy2 of FIGS. 19 and 20 are used, it is possible to realize the X-axis external magnetic field detection operation and the Y-axis external magnetic field detection operation.

The XY-axis detection mode, which is a kind of normal mode, will be described. In the XY-axis detection mode, the X-axis and Y-axis external magnetic field detection operations are simultaneously executed using the Hall element $10xy$. However, in the XY-axis detection mode, the Z-axis external magnetic field detection operation using the Hall element $10z$ may also be separately executed.

Figure 22:
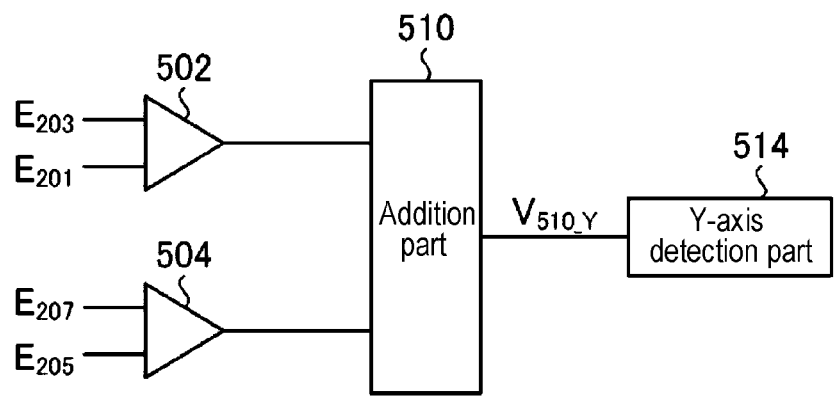
FIG. 22 is a diagram showing a configuration of a circuit functioning in an XY-axis detection mode according to the third embodiment of the present disclosure and respective signals.
Figure 22:
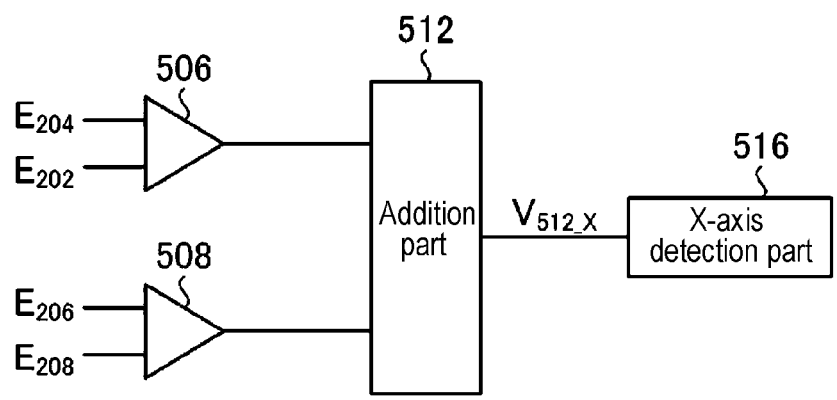

FIG. 22 shows a signal input state to an amplifier or the like in the XY-axis detection mode. The potentials of the electrodes 201 to 208 are represented by symbols "$E_{201}$ to $E_{208}$", respectively.

In the XY-axis detection mode, the amplifier 502 is connected to the electrodes 203 and 201 and outputs an amplified signal of the potential difference ($E_{203}$–$E_{201}$) between the electrodes 203 and 201 with respect to the potential $E_{201}$. In the XY-axis detection mode, the amplifier 504 is connected to the electrodes 207 and 205 and outputs an amplified signal of the potential difference ($E_{207}$–$E_{205}$) between the electrodes 207 and 205 with respect to the potential $E_{205}$. In the XY-axis detection mode, the amplifier 506 is connected to the electrodes 204 and 202 and outputs an amplified signal of the potential difference ($E_{204}$–$E_{202}$) between the electrodes 204 and 202 with respect to the potential $E_{202}$. In the XY-axis detection mode, the amplifier 508 is connected to the electrodes 206 and 208 and outputs an amplified signal of the potential difference ($E_{206}$–$E_{208}$) between the electrodes 206 and 208 with respect to the potential Ems.

In the XY-axis detection mode, the addition part 510 outputs an added voltage $V_{510\_Y}$ representing the sum of the voltage value of the output signal of the amplifier 502 and the voltage value of the output signal of the amplifier 504, and the addition part 512 outputs an added voltage $V_{512\_X}$ representing the sum of the voltage value of the output signal of the amplifier 506 and the voltage value of the output signal of the amplifier 508.

Figure 23:
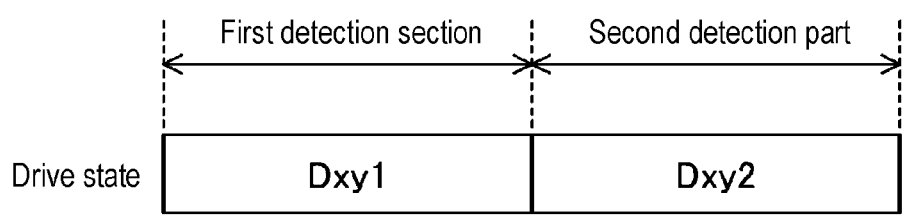
FIG. 23 is a diagram showing a driving state of the Hall element in the XY-axis detection mode according to the third embodiment of the present disclosure.

In the XY-axis detection mode, the control circuit 70 sets first and second detection sections that are different from each other. As in the first embodiment, it is assumed that the second detection section is set after the first detection section (the same applies to the X-axis detection mode and the Y-axis detection mode described later). As shown in FIG. 23, in the XY-axis detection mode, the drive state of the Hall element $10xy$ is set to the drive state Dxy1 (see FIG. 19) in the first detection section, and the drive state of the Hall element $10xy$ is set to the drive state Dxy2 (see FIG. 20) in the second detection section.

In the XY-axis detection mode, the Y-axis detection part 514 holds the output voltage $V_{510\_Y}$ of the addition part 510 in the first detection section as a voltage $V_{510\_Y}[1]$. When the output voltage $V_{510\_Y}$ of the addition part 510 in the second detection section is obtained as a voltage $V_{510\_Y}[2]$, the Y-axis detection part 514 derives a difference voltage ($V_{510\_Y}[1]$–$V_{510\_Y}[2]$) between the voltage $V_{510\_Y}[1]$ and the voltage $V_{510\_Y}[2]$. The offset is canceled at the difference voltage. The difference voltage ($V_{510\_Y}[1]$–$V_{510\_Y}[2]$) is a signal (magnetic field detection voltage) indicating the detection result of the external magnetic field in the Y-axis direction by the Y-axis external magnetic field detection operation. The difference voltage ($V_{510\_Y}[1]$–$V_{510\_Y}[2]$) represents at least the magnitude of the external magnetic field in the Y-axis direction and may also represent the polarity of the external magnetic field in the Y-axis direction (whether the external magnetic field in the Y-axis direction is in the positive direction or the negative direction).

In the XY-axis detection mode, the X-axis detection part 516 holds the output voltage $V_{512\_X}$ of the addition part 512 in the first detection section as a voltage $V_{512\_X}[1]$. When the output voltage $V_{512\_X}$ of the addition part 512 in the second detection section is obtained as a voltage $V_{512\_X}[2]$, the X-axis detection part 516 derives a difference voltage ($V_{512\_X}[1]$–$V_{512\_X}[2]$) between the voltage $V_{512\_X}[1]$ and the voltage $V_{512\_X}[2]$. The offset is canceled at the difference voltage. The difference voltage ($V_{512\_X}[1]$–$V_{512\_X}[2]$) is a signal (magnetic field detection voltage) indicating the detection result of the external magnetic field in the X-axis direction by the X-axis external magnetic field detection operation. The difference voltage ($V_{512\_X}[1]$–$V_{512\_X}[2]$) represents at least the magnitude of the external magnetic field in the X-axis direction and may also represent the polarity of the external magnetic field in the X-axis direction (whether the external magnetic field in the X-axis direction is in the positive direction or the negative direction).

Figure 24:
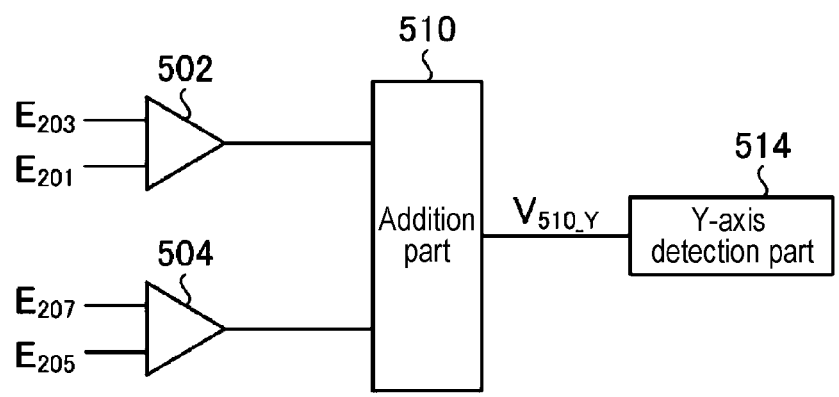
FIG. 24 is a diagram showing a configuration of a circuit functioning in a Y-axis detection mode according to the third embodiment of the present disclosure and respective signals.

FIG. 24 shows a signal input state to an amplifier or the like in the Y-axis detection mode. In the Y-axis detection mode, only the Y-axis external magnetic field detection operation is executed using the Hall element $10xy$. However, in the Y-axis detection mode, the Z-axis external magnetic field detection operation using the Hall element $10z$ may also be separately executed.

In the Y-axis detection mode, the amplifier 502 is connected to the electrodes 203 and 201 and outputs an amplified signal of the potential difference ($E_{203}$–$E_{201}$) between the electrodes 203 and 201 with respect to the potential $E_{201}$. In the Y-axis detection mode, the amplifier 504 is connected to the electrodes 207 and 205 and outputs an amplified signal of the potential difference ($E_{207}$–$E_{205}$) between the electrodes 207 and 205 with respect to the potential $E_{205}$. In the Y-axis detection mode, the addition part 510 outputs an added voltage $V_{510\_Y}$ representing the sum of the voltage value of the output signal of the amplifier 502 and the voltage value of the output signal of the amplifier 504. As shown in FIG. 23, in the Y-axis detection mode, the drive state of the Hall element $10xy$ is set to the drive state Dxy1 (see FIG. 19) in the first detection section, and the drive state of the Hall element $10xy$ is set to the drive state Dxy2 (see FIG. 20) in the second detection section. In the Y-axis detection mode, the Y-axis detection part 514 holds the output voltage $V_{510\_Y}$ of the addition part 510 in the first detection section as a voltage $V_{510\_Y}[1]$. When the output voltage $V_{510\_Y}$ of the addition part 510 in the second detection section is obtained as a voltage $V_{510\_Y}[2]$, the Y-axis detection part 514 derives a difference voltage ($V_{510\_Y}[1]$–$V_{510\_Y}[2]$) between the voltage $V_{510\_Y}[1]$ and the voltage $V_{510\_Y}[2]$. The meaning of the difference voltage is the same as that in the XY-axis detection mode.

Figure 25:
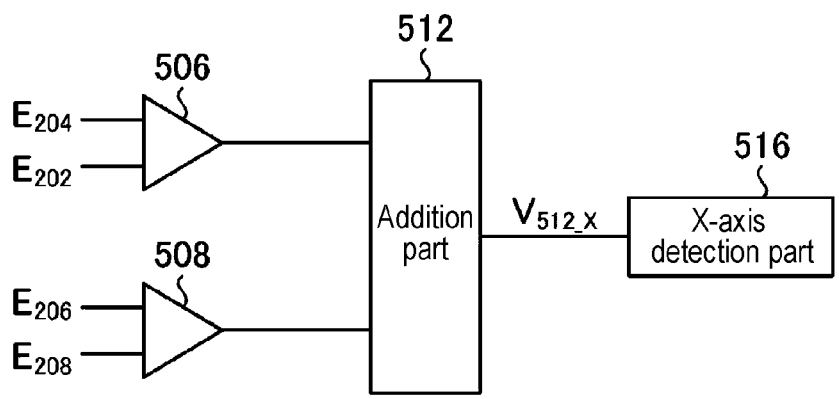
FIG. 25 is a diagram showing a configuration of a circuit functioning in an X-axis detection mode according to the third embodiment of the present disclosure and respective signals.

FIG. 25 shows a signal input state to an amplifier or the like in the X-axis detection mode. In the X-axis detection mode, only the X-axis external magnetic field detection operation is executed using the Hall element $10xy$. However, in the X-axis detection mode, the Z-axis external magnetic field detection operation using the Hall element $10z$ may also be separately executed.

In the X-axis detection mode, the amplifier 506 is connected to the electrodes 204 and 202 and outputs an amplified signal of the potential difference ($E_{204}$–$E_{202}$) between the electrodes 204 and 202 with respect to the potential $E_{201}$. In the Y-axis detection mode, the amplifier 508 is connected to the electrodes 206 and 208 and outputs an amplified signal of the potential difference ($E_{206}$–$E_{208}$) between the electrodes 206 and 208 with respect to the potential Ems. In the X-axis detection mode, the addition part 512 outputs an added voltage $V_{512\_X}$ representing the sum of the voltage value of the output signal of the amplifier 506 and the voltage value of the output signal of the amplifier 508. As shown in FIG. 23, in the X-axis detection mode, the drive state of the Hall element 10xy is set to the drive state Dxy1 (see FIG. 19) in the first detection section, and the drive state of the Hall element 10xy is set to the drive state Dxy2 (see FIG. 20) in the second detection section. In the X-axis detection mode, the X-axis detection part 516 holds the output voltage $V_{512\_X}$ of the addition part 512 in the first detection section as a voltage $V_{512\_X}[1]$. When the output voltage $V_{512\_X}$ of the addition part 512 in the second detection section is obtained as a voltage $V_{512\_X}[2]$, the X-axis detection part 516 derives a difference voltage $(V_{512\_X}[1]-V_{512\_X}[2])$ between the voltage $V_{512\_X}[1]$ and the voltage $V_{512\_X}[2]$. The meaning of the difference voltage is the same as that in the XY axis detection mode.

Although the method using the drive states Dxy1 and Dxy2 in any of the XY-axis detection mode, the Y-axis detection mode, and the X-axis detection mode is described here, the Y-axis external magnetic field detection operation may be realized by using a drive state dedicated to the Y-axis detection mode, or the X-axis external magnetic field detection operation may be realized by using a drive state dedicated to the X-axis detection mode.

Figure 26:
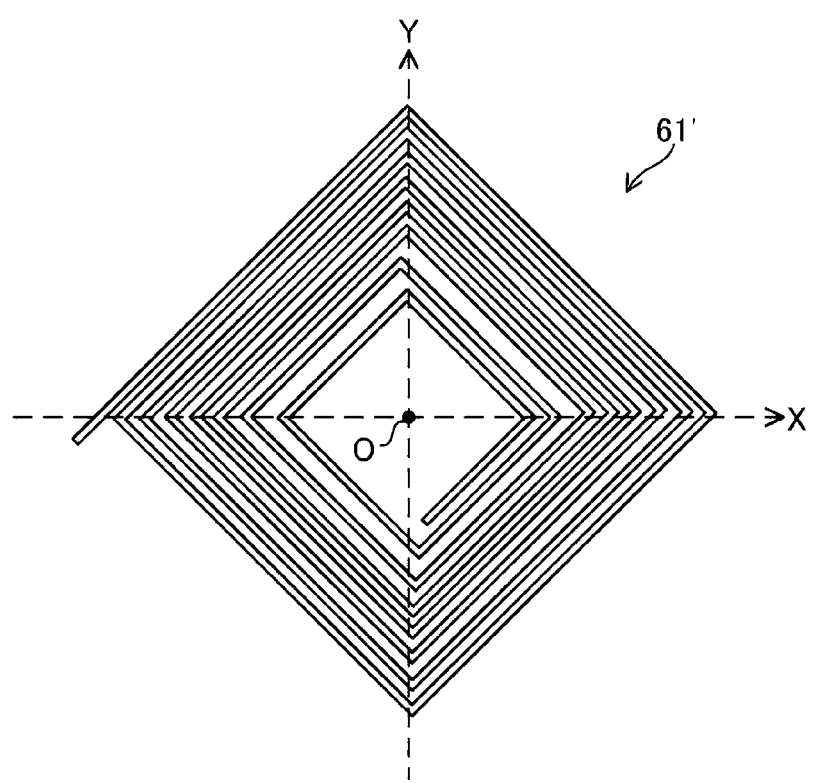
FIG. 26 is a plan view of a test magnetic field generation coil according to the third embodiment of the present disclosure.

The shape of the coil 61' installed in the test magnetic field generation circuit 60 will be described with reference to FIG. 26. In the present embodiment, the coil 61' of FIG. 26 is used as the coil 61 of FIG. 6. The description of the first embodiment may be applied to the present embodiment and when the first embodiment is applied to the present embodiment, the coil 61 in the description of the first embodiment is read as coil 61'. For the sake of convenience of explanation, the shape of the coil 61' will be described under the assumption that the X axis, the Y axis, and the Z axis are orthogonal to each other at the origin O and the center of the coil 61' is located at the origin O. In FIG. 26, the X axis and the Y axis are indicated by broken lines (the same applies to FIGS. 27, 28, 31 and 32 described later). The coil 61' is formed on a plane parallel to the XY plane. In FIG. 26, the coil 61' is shown as if it is formed on a single plane. However, the coil 61' may be formed by using a plurality of layers of a semiconductor substrate. The coil 61' has a point-symmetrical structure with respect to the origin O and a line-symmetrical structure with respect to each of the X axis and the Y axis, although the target structure may collapse in fine portions.

Now, a square-shaped wiring having a center at the origin O and having two sides parallel to the X axis and two sides parallel to the Y axis is assumed. A wiring obtained by rotating the above-mentioned wiring around the origin O by 45° with the Z axis as a rotation axis is referred to as an oblique square wiring for the sake of convenience. The coil 61' has a structure obtained by connecting a plurality of oblique square wirings having different sizes.

Figure 27:
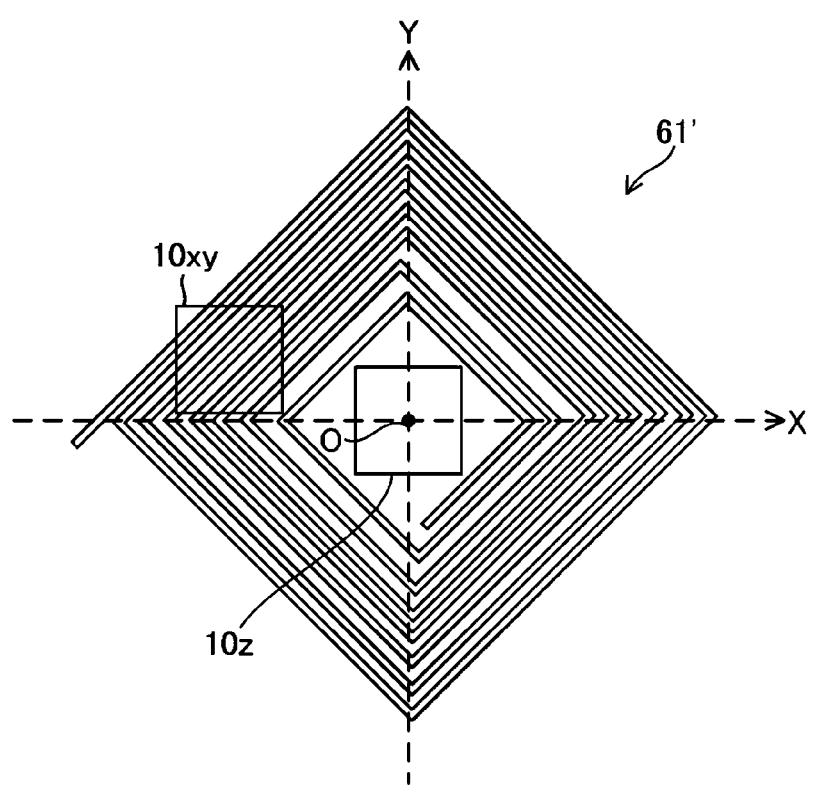
FIG. 27 is a diagram showing a positional relationship between the test magnetic field generation coil and two Hall elements according to the third embodiment of the present disclosure.

Further, in the present embodiment, the positive direction and the negative direction of the Z axis when viewed from the origin O are regarded as an upward direction and a downward direction, respectively. FIG. 27 shows the positional relationship between the coil 61' and the Hall elements 10z and 10xy. The entirety or most of the Hall element 10z is arranged below the coil 61' and inside the wiring arrangement position of the coil 61'. In the example of FIG. 27, the center of the Hall element 10z is located on the Z axis. Therefore, when a test magnetic field is generated by supplying a coil current $I_L$ to the coil 61', the test magnetic field acts as a magnetic field in the Z-axis direction with respect to the Hall element 10z. The Hall element 10z may be provided on the same plane as the wiring arrangement position of the coil 61'.

The entirety or most of the Hall element 10xy is arranged directly under the wiring of the coil 61'. However, in FIG. 27, the overall outer shape of the Hall element 10xy is clearly shown on the drawing so that the positional relationship between the coil 61' and the Hall element 10xy can be visually recognized with ease (the same applies to FIG. 28 described later). As described with respect to the Hall element 100 in the second embodiment, two sides of the four sides of the square as the external shape of the Hall element 10xy when viewed in a plan view from the Z-axis direction are parallel to the X axis, and the remaining two sides are parallel to the Y axis. When a square as the outer shape of the Hall element 10xy is projected onto the arrangement plane of the wiring of the coil 61', each side of the square and the wiring of the coil 61' intersect at a predetermined angle. This predetermined angle is ideally 45° but may deviate slightly from 45°. Therefore, when a test magnetic field is generated by supplying the coil current $I_L$ to the coil 61', the test magnetic field acting on the Hall element 10xy includes an X-axis component and a Y-axis component.

The current source 62 (see FIG. 6) in the test magnetic field generation circuit 60 can supply the coil current $I_L$ to the coil 61' in a third or fourth direction. The third and fourth directions are opposite to each other. The direction of the test magnetic field when the coil current $I_L$ flows in the third direction and the direction of the test magnetic field when the coil current $I_L$ flows in the fourth direction are opposite to each other. As described in the first embodiment, it is assumed that the polarity of the coil current $I_L$ in the third direction is positive, and the polarity of the coil current $I_L$ in the fourth direction is negative.

Figure 28:
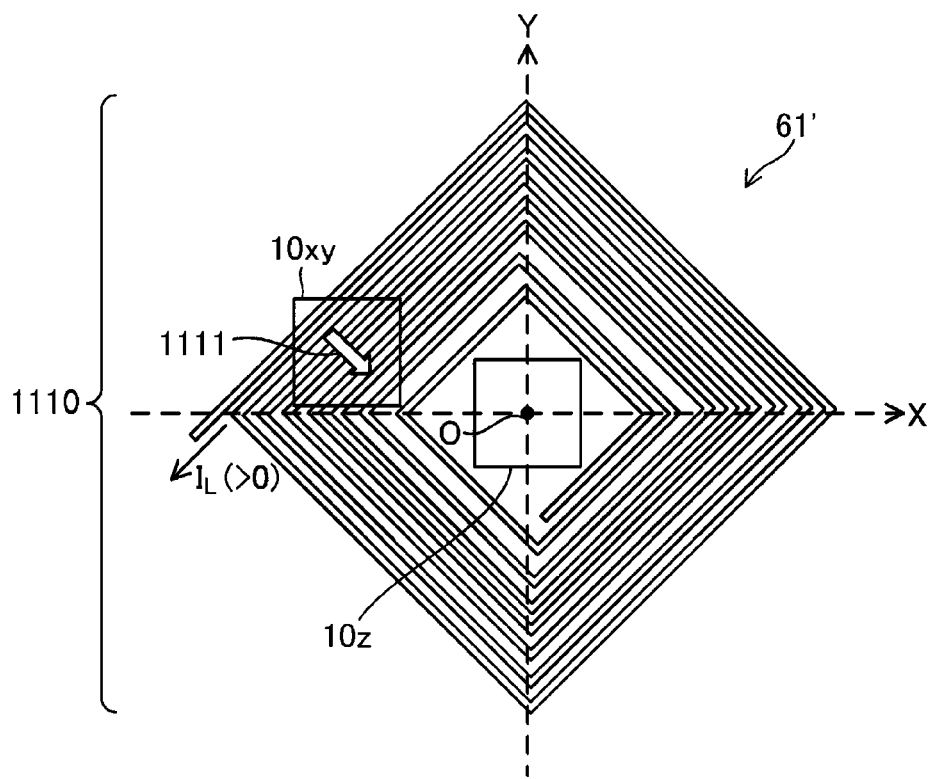
FIG. 28 is a diagram showing the directions of the magnetic field generated by the coil according to the third embodiment of the present disclosure.
Figure 28:
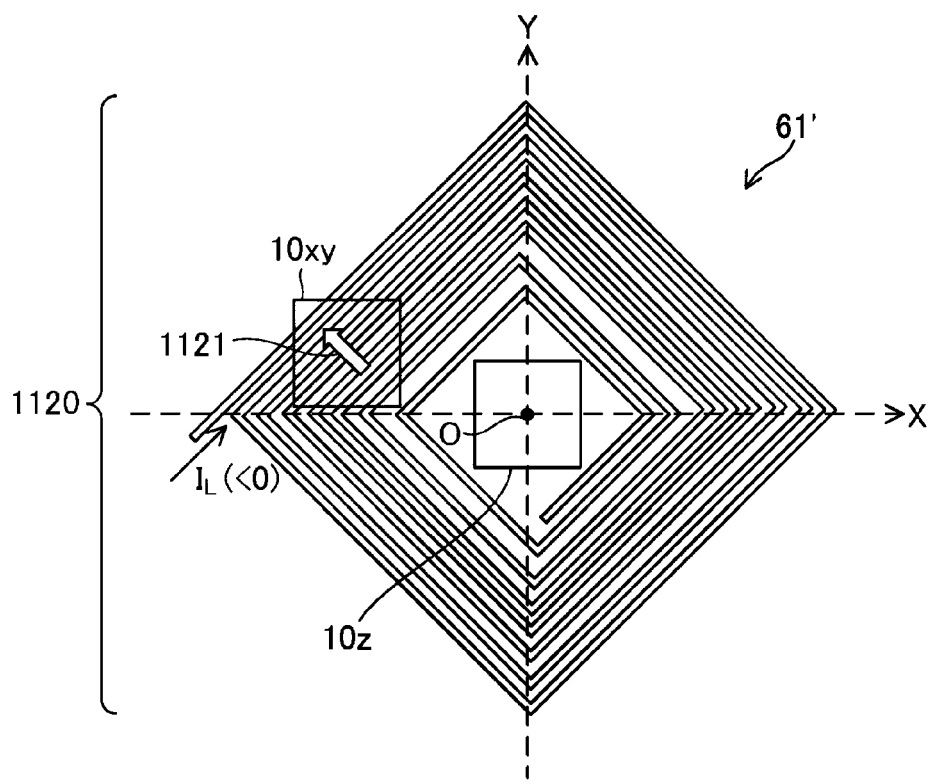

In FIG. 28, a state 1110 represents a state of the test magnetic field when "$I_L>0$", and an arrow 1111 indicates the direction of the test magnetic field acting on the Hall element 10xy in the state 1110. A state 1120 represents a state of the test magnetic field when "$I_L<0$", and an arrow 1121 indicates the direction of the test magnetic field acting on the Hall element 10xy in the state 1120. The direction of the test magnetic field in the X-axis direction acting on the Hall element 10xy (in other words, the direction of the X-axis component of the test magnetic field) is opposite between the state 1110 and the state 1120. Similarly, the direction of the Y-axis direction test magnetic field acting on the Hall element 10xy (in other words, the direction of the Y-axis component of the test magnetic field) is opposite between the state 1110 and the state 1120. In addition, the direction of the Z-axis direction test magnetic field acting on the Hall element 10z (in other words, the direction of the Z-axis component of the test magnetic field) is opposite between the state 1110 and the state 1120.

Therefore, the method described in the first embodiment makes it possible to perform the test operation on the X axis, the Y axis, and the Z axis.

Figure 29:
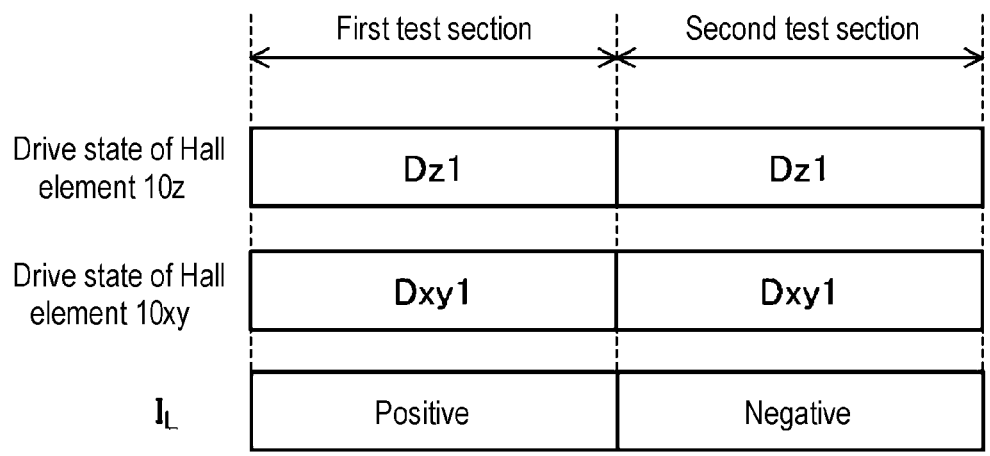
FIG. 29 is a diagram showing the drive state of the Hall element and the polarity of the coil current in a test operation according to the third embodiment of the present disclosure.

The test operation executed in the test mode related to the magnetic sensor 2 will be described with reference to FIG. 29. The test operation is performed by the Hall elements 10z and 10xy, the switch circuits 20z and 20xy, the magnetic field detection circuits 30z and 30xy, the drive source 50, and the test magnetic field generation circuit 60 under the control of the control circuit 70. The test operation includes an operation during the first test section and an operation during the second test section. The first test section and the second test section are sections separated from each other. In the example of FIG. 29, the second test section is set after the first test section. However, the first test section may be set after the second test section.

In both the first and second test sections, the drive state of the Hall element 10z is set to the drive state Dz1 (see FIG. 3) by the function of the switch circuit 20z, and the drive state of the Hall element 10xy is set to the drive state Dxy1 (see FIG. 19) by the function of the switch circuit 20xy. In the first test section, a positive coil current $I_L$ is supplied to the coil 61', and in the second test section, a negative coil current $I_L$ is supplied to the coil 61'. Therefore, in the first test section and the second test section, the direction of the Z-axis direction test magnetic field acting on the Hall element 10z becomes opposite, the direction of the X-axis direction test magnetic field acting on the Hall element 10xy becomes opposite, and the direction of the Y-axis direction test magnetic field acting on the Hall element 10xy becomes opposite.

With respect to the Z-axis direction, the processing content of the magnetic field detection circuit 30z in the test operation is the same as that of the magnetic field detection circuit 30 according to the first embodiment.

In the magnetic field detection circuit 30xy related to the test operation, the addition part 510 shown in FIG. 22 or the like outputs an added voltage $V_{510\_Y}$ representing the sum of the voltage value of the output signal of the amplifier 502 and the voltage value of the output signal of the amplifier 504, and the addition part 512 shown in FIG. 22 or the like outputs an added voltage $V_{512\_X}$ representing the sum of the voltage value of the output signal of the amplifier 506 and the voltage value of the output signal of the amplifier 508.

In the test operation, the Y-axis detection part 514 holds the output voltage $V_{510\_Y}$ of the addition part 510 in the first test section as a voltage $V_{510\_Y\_TEST}[1]$. When the output voltage $V_{510\_Y}$ of the addition part 510 in the second detection section is obtained as a voltage $V_{510\_Y\_TEST}[2]$, the Y-axis detection part 514 derives a difference voltage $(V_{510\_Y\_TEST}[1]-V_{510\_Y\_TEST}[2])$ between the voltage $V_{510\_Y\_TEST}[1]$ and the voltage $V_{510\_Y\_TEST}[2]$. The difference voltage $(V_{510\_Y\_TEST}[1]-V_{510\_Y\_TEST}[2])$ has a zero or positive voltage value and is referred to as a Y-axis direction test result signal. The offset is canceled at the difference voltage. The difference voltage does not include the component of the external magnetic field and contains only the component of the test magnetic field. If there is no abnormality in the Hall element 10xy, the switch circuit 20xy, and the magnetic field detection circuit 30xy, the difference voltage $(V_{510\_Y\_TEST}[1]-V_{510\_Y\_TEST}[2])$ becomes a constant voltage (>0) or more.

In the test operation, the X-axis detection part 516 holds the output voltage $V_{512\_X}$ of the addition part 512 in the first test section as a voltage $V_{512\_X\_TEST}[1]$. When the output voltage $V_{512\_X}$ of the addition part 512 in the second detection section is obtained as a voltage $V_{512\_X\_TEST}[2]$, the X-axis detection part 516 derives a difference voltage $(V_{512\_X\_TEST}[1]-V_{512\_X\_TEST}[2])$ between the voltage $V_{512\_X\_TEST}[1]$ and the voltage $V_{512\_X\_TEST}[2]$. The difference voltage $(V_{512\_X\_TEST}[1]-V_{512\_X\_TEST}[2])$ has a zero or positive voltage value and is referred to as an X-axis direction test result signal. The offset is canceled at the difference voltage. The difference voltage does not include the component of the external magnetic field and contains only the component of the test magnetic field. If there is no abnormality in the Hall element 10xy, the switch circuit 20xy, and the magnetic field detection circuit 30xy, the difference voltage $(V_{512\_X\_TEST}[1]-V_{512\_X\_TEST}[2])$ becomes a constant voltage (>0) or more.

The operation of the output circuit 40 in the test mode will be described. The operation of the output circuit 40 in the Z-axis direction may be the same as described in the first embodiment. However, under the assumption that the magnetic field detection voltage $V_{MZ}$ generated and outputted in the test operation (i.e., the voltage proportional to the difference voltage $V_{DEF\_TEST}$) (see FIG. 10) is a Z-axis direction test result signal, the behavior of the output circuit 40 of the third embodiment is described.

The output circuit 40 includes an abnormality signal output circuit 48 (see FIG. 21). The abnormality signal output circuit 48 outputs a predetermined abnormality signal to the outside (e.g., to the host system (not shown)) when the X-axis direction test result signal satisfies a predetermined X-axis abnormality determination condition, when the Y-axis direction test result signal satisfies a predetermined Y-axis abnormality determination condition, or when the Z-axis direction test result signal satisfies a predetermined Z-axis abnormality determination condition. The type of the abnormality signal to be outputted may vary depending on which of the X-axis, Y-axis, and Z-axis abnormality determination conditions is satisfied.

For example, in the test mode, the output circuit 40 compares the voltage represented by the X-axis direction test result signal $(V_{512\_X\_TEST}[1]-V_{512\_X\_TEST}[2])$ with a predetermined reference voltage $V_{REFX}$. When the former is lower than the latter, the output circuit 40 determines that the X-axis abnormality determination condition is satisfied $(V_{REFX}>0)$. Similarly, the output circuit 40 compares the voltage represented by the Y-axis direction test result signal $(V_{510\_Y\_TEST}[1]-V_{510\_Y\_TEST}[2])$ with a predetermined reference voltage $V_{REFY}$. When the former is lower than the latter, the output circuit 40 determines that the Y-axis abnormality determination condition is satisfied $(V_{REFY}>0)$. Similarly, the output circuit 40 compares the voltage represented by the Z-axis direction test result signal (the voltage proportional to the difference voltage $V_{DEF\_TEST}$) (see FIG. 10) with a predetermined reference voltage $V_{REFZ}$. When the former is lower than the latter, the output circuit 40 determines that the Z-axis abnormality determination condition is satisfied $(V_{REFZ}>0)$. It does not matter whether the reference voltages $V_{REFX}$, $V_{REFY}$ and $V_{REFZ}$ match or not. Alternatively, in the test mode, the output circuit 40 may determine that the X-axis abnormality determination condition is satisfied when the voltage represented by the X-axis direction test result signal deviates from a predetermined normal voltage range having upper and lower limits. The same may apply to the Y-axis direction and the Z-axis direction.

According to the present embodiment, it is possible to determine whether or not the magnetic sensor 2 is capable of normally performing magnetic detection for each of the X axis, the Y axis, and the Z axis (that is, the magnetic sensor 2 is capable of performing a self-test).

The drive state of the Hall element 10z may be set to the drive state Dz2 in both the first and second test sections. The drive state of the Hall element 10xy may be set to the drive state Dxy2 in both the first and second test sections. The coil current $I_L$ is supplied to the coil 61' only during the period in which the test operation is performed (i.e., only in the first and second test sections). Therefore, when the external magnetic field detection operation is performed (hence, in the first and second detection sections), the coil current $I_L$ is zero.

Figure 30:
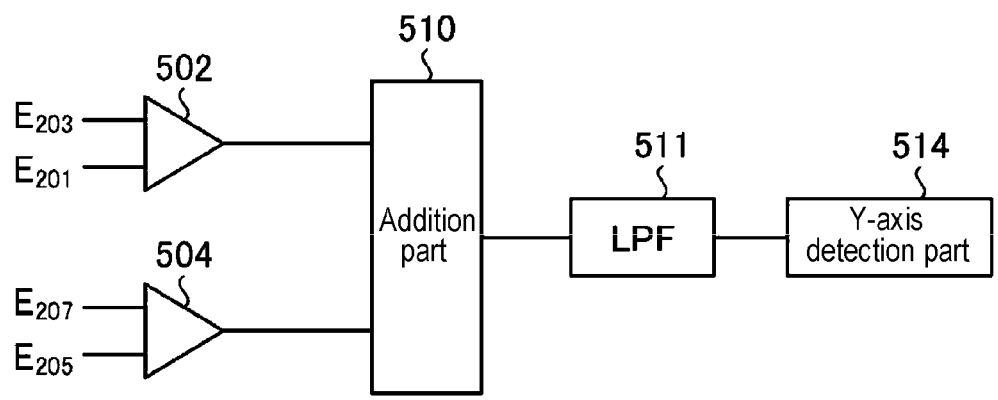
FIG. 30 is a diagram showing an insertion position of a low-pass filter that can be installed in a magnetic field detection circuit according to the third embodiment of the present disclosure.
Figure 30:
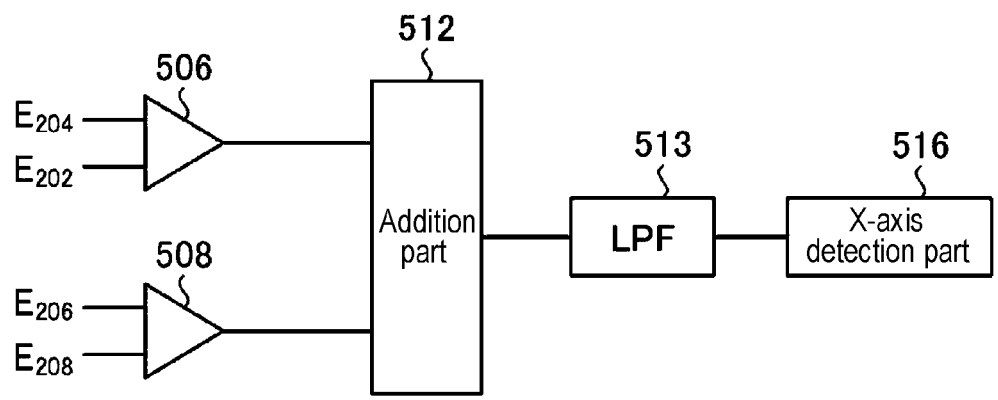

The contents shown in Examples EX1_A to EX1_D belonging to the first embodiment may be applied to the third embodiment. Therefore, for example, as shown in FIG. 30, in the magnetic field detection circuit 30xy, an LPF (low-pass filter) 511 may be inserted between the addition part 510 and the Y-axis detection part 514, and an LPF (low-pass filter) 513 may be inserted between the addition part 512 and the X-axis detection part 516. In the test operation, the magnetic field detection circuit 30xy generates the Y-axis direction test result signal according to the difference between the Hall voltage generated by the Y-axis direction test magnetic field acting on the Hall element 10 in the first test section and the Hall voltage generated by the Y-axis direction test magnetic field acting on the Hall element 10xy in the second test section. The LPF 511 is inserted into a signal path for generating the Y-axis direction test result signal. Similarly, in the test operation, the magnetic field detection circuit 30xy generates the X-axis direction test result signal according to the difference between the Hall voltage generated by the X-axis direction test magnetic field acting on the Hall element 10xy in the first test section and the Hall voltage generated by the X-axis direction test magnetic field acting on the Hall element 10 in the second test section. The LPF 513 is inserted into a signal path for generating the X-axis direction test result signal.

Each of the LPFs 511 and 513 has the same characteristics as the LPF 32 (see FIG. 10). According to the configuration of FIG. 30, the output voltage of the addition part 510 is inputted to the Y-axis detection part 514 after being subjected to a low frequency passing process by the LPF 511, and the output voltage of the addition part 512 is inputted to the X-axis detection part 516 after being subjected to a low frequency passing process by the LPF 513. The external magnetic field may contain a Y-axis direction AC component during the execution period of the test operation. However, the AC component can be removed by the LPF 511. The same applies to an X-axis direction AC component.

Fourth Embodiment

The fourth embodiment of the present disclosure is described. The fourth embodiment is a modification of a part of the third embodiment. In the magnetic sensor 2 according to the third embodiment, a plurality of Hall elements 10z may be installed. Additionally or alternatively, a plurality of Hall elements 10xy may be installed. For example, a configuration will be described in which as shown in FIG. 31, four Hall elements 10z and eight Hall elements 10xy are installed in the magnetic sensor 2.

Figure 31:
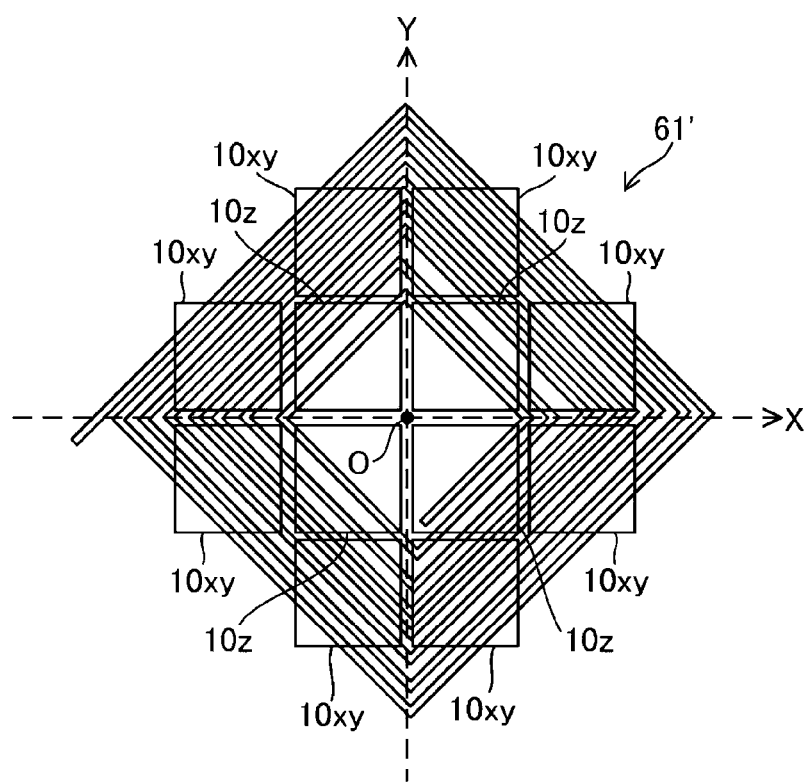
FIG. 31 is a diagram showing a positional relationship between a test magnetic field generation coil and a plurality of Hall elements according to a fourth embodiment of the present disclosure.

FIG. 31 is a diagram showing a positional relationship between the coil 61' and each Hall element. A portion (preferably most) of each of the plurality of Hall elements 10z is arranged below the coil 61' and inside the wiring arrangement position of the coil 61'. In FIG. 31, the overall outer shape of each Hall element 10z is clearly shown in the drawing so that the positional relationship between the coil 61' and each Hall element 10z can be visually recognized with ease (the same applies to FIG. 32 described later). The entire Hall element 10z may be arranged below the coil 61' and inside the wiring arrangement position of the coil 61'. The four Hall elements 10z are arranged one by one in the first to fourth quadrants of the XY plane (hereinafter simply referred to as first to fourth quadrants). Among the four Hall elements 10z, the Hall elements 10z located in the first and second quadrants and the Hall elements 10z located in the fourth and third quadrants are in a line-symmetrical positional relationship with respect to the X axis. Among the four Hall elements 10z, the Hall elements 10z located in the first and fourth quadrants and the Hall elements 10z located in the second and third quadrants are in a line-symmetrical positional relationship with respect to the Y axis. When a test magnetic field is generated by supplying a coil current $I_L$ to the coil 61', the test magnetic field acts as a Z-axis direction magnetic field for each Hall element 10z.

On the XY plane, four Hall elements 10z are arranged inside the eight Hall elements 10xy (in other words, eight Hall elements 10xy are arranged at positions surrounding the four Hall elements 10z). The entirety or most of each of the Hall elements 10xy is arranged directly under the wiring of the coil 61'. In FIG. 31, the overall outer shape of each Hall element 10xy is clearly shown in the drawing so that the positional relationship between the coil 61' and each Hall element 10xy can be visually recognized with ease (the same applies to FIG. 32 described later). Eight Hall elements 10xy are arranged two by two in the first to fourth quadrants of the XY plane. Among the eight Hall elements 10xy, the four Hall elements 10xy located in the first and second quadrants and the four Hall elements 10xy located in the fourth and third quadrants have a line-symmetrical positional relationship with respect to the X axis. Among the eight Hall elements 10xy, the four Hall elements 10xy located in the first and fourth quadrants and the four Hall elements 10xy located in the second and third quadrants have a line-symmetrical positional relationship with respect to the Y axis.

As for the two Hall elements 10xy and one Hall element 10z in the first quadrant, one of the two Hall elements 10xy is arranged adjacent to the positive side of the X axis when viewed from the Hall element 10z, and the other Hall element 10xy is arranged adjacent to the positive side of the Y axis when viewed from the Hall element 10z. As for the two Hall elements 10xy and one Hall element 10z in the second quadrant, one of the two Hall elements 10xy is arranged adjacent to the negative side of the X axis when viewed from the Hall element 10z, and the other Hall element 10xy is arranged adjacent to the positive side of the Y axis when viewed from the Hall element 10z. As for the two Hall elements 10xy and one Hall element 10z in the third quadrant, one of the two Hall elements 10xy is arranged adjacent to the negative side of the X axis when viewed from the Hall element 10z, and the other Hall element 10xy is arranged adjacent to the negative side of the Y axis when viewed from the Hall element 10z. As for the two Hall elements 10xy and one Hall element 10z in the fourth quadrant, one of the two Hall elements 10xy is arranged adjacent to the positive side of the X axis when viewed from the Hall element 10z, and the other Hall element 10xy is arranged adjacent to the negative side of the Y axis when viewed from the Hall element 10z.

As described with respect to the Hall element 100 in the second embodiment, two sides of the four sides of the square as the external shape of the Hall element 10xy when viewed in a plan view from the Z-axis direction are parallel to the X axis, and the remaining two sides are parallel to the Y axis. This may be applied to all Hall elements 10xy in present embodiment. For each of the eight Hall elements 10xy, when a square as the external shape of the Hall element 10xy is projected onto the wiring arrangement plane of the coil 61', each side of the square and the wiring of the coil 61' intersect at a predetermined angle. This predetermined angle is ideally 45° but may deviate slightly from 45°. Therefore, when a test magnetic field is generated by supplying a coil current $I_L$ to the coil 61', the test magnetic field acting on each Hall element 10xy contains an X-axis component and a Y-axis component.

The current source 62 in the test magnetic field generation circuit 60 can supply the coil current $I_L$ to the coil 61' in the third direction or the fourth direction. As described above, the third and fourth directions are opposite to each other, and the direction of the test magnetic field when the coil current $I_L$ flows in the third direction and the direction of the test magnetic field when the coil current $I_L$ flows in the fourth direction are opposite to each other. As described in the first embodiment, it is assumed that the polarity of the coil current $I_L$ in the third direction is positive, and the polarity of the coil current $I_L$ in the fourth direction is negative.

Figure 32:
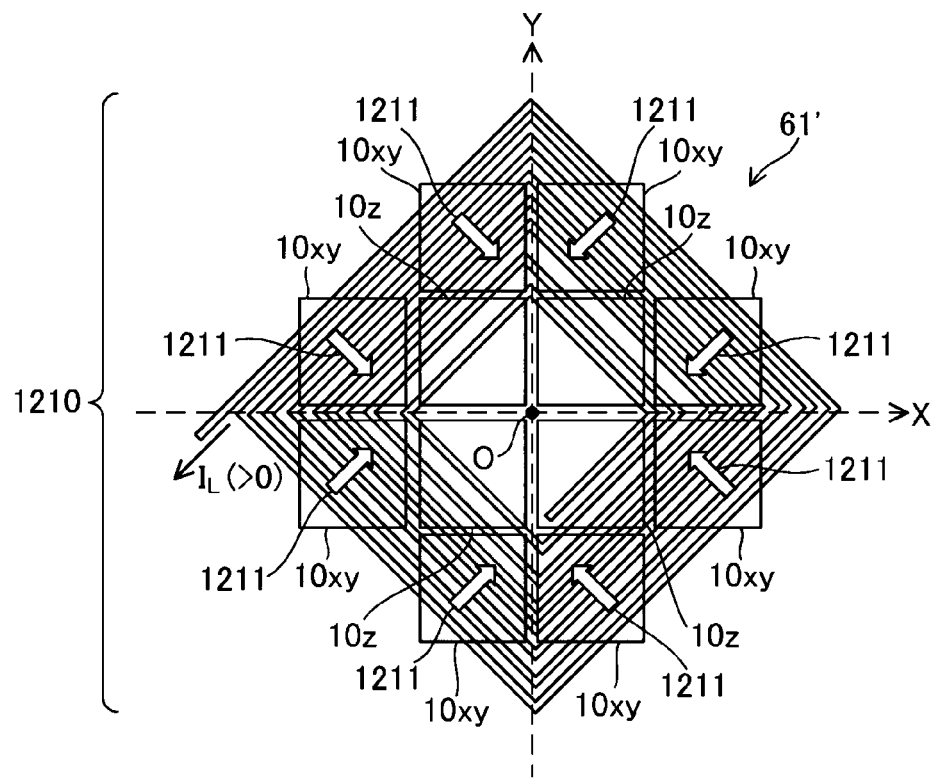
FIG. 32 is a diagram showing the directions of the magnetic field generated by the coil according to the fourth embodiment of the present disclosure.
Figure 32:
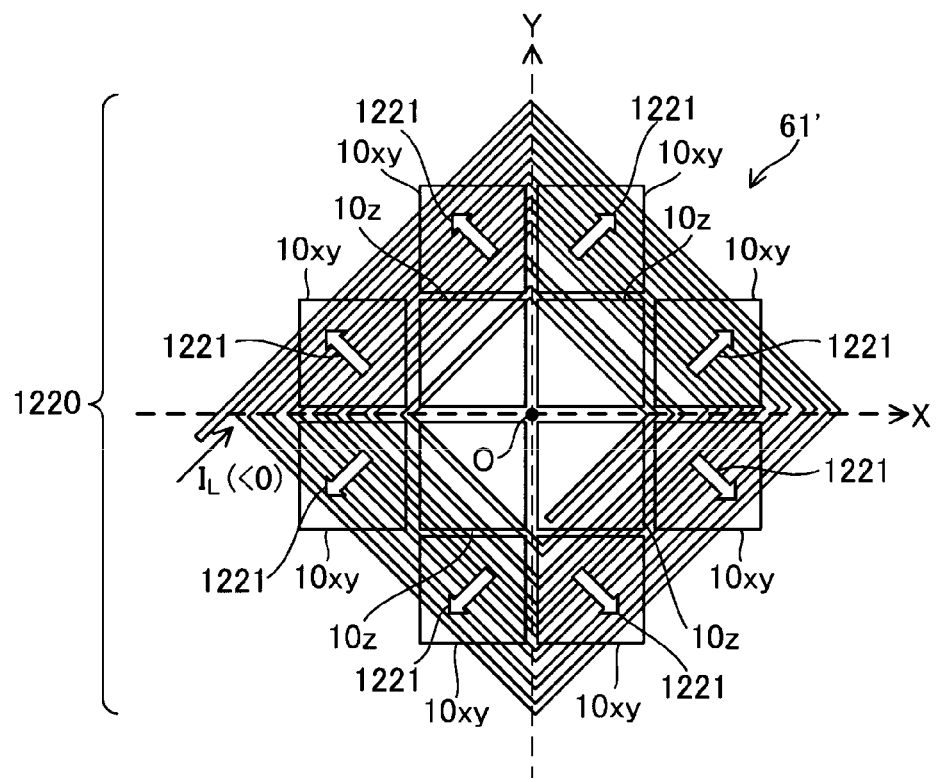

In FIG. 32, a state 1210 represents a state of the test magnetic field when "$I_L>0$", and eight arrows 1211 indicate the directions of the test magnetic fields acting on the eight Hall elements 10xy in the state 1210. A state 1220 represents a state of the test magnetic field when "$I_L<0$", and eight arrows 1221 indicate the directions of the test magnetic fields acting on the eight Hall elements 10xy in the state 1220. The direction of the X-axis direction test magnetic field acting on each Hall element 10xy (in other words, the direction of the X-axis component of the test magnetic field) is opposite between the state 1210 and the state 1220. Similarly, the direction of the Y-axis direction test magnetic field acting on each Hall element 10xy (in other words, the direction of the Y-axis component of the test magnetic field) is opposite between the state 1210 and the state 1220. In addition, the direction of the Z-axis direction test magnetic field acting on each Hall element 10z (in other words, the direction of the Z-axis component of the test magnetic field) is opposite between the state 1210 and the state 1220. Therefore, the test operation can be executed by the method shown in the third embodiment.

A method of detecting a magnetic field using a plurality of Hall voltages generated in a plurality of Hall elements is known. The known method can be applied to the fourth embodiment. That is, for example, in the Z-axis external magnetic field detection operation, the magnetic field detection circuit 30z may detect a Z-axis direction external magnetic field using the sum or average of the Hall voltages generated by the four Hall elements 10z based on the Z-axis direction external magnetic field. Similarly, in the X-axis external magnetic field detection operation, the magnetic field detection circuit 30xy may detect an X-axis direction external magnetic field using the sum or average of the Hall voltages generated by the eight Hall elements 10xy based on the X-axis direction external magnetic field. Similarly, in the Y-axis external magnetic field detection operation, the magnetic field detection circuit 30xy may detect a Y-axis direction external magnetic field using the sum or average of the Hall voltages generated by the eight Hall elements 10xy based on the Y-axis direction external magnetic field. By using a plurality of Hall elements, it is possible to improve the detection accuracy or the detection sensitivity.

When the plurality of Hall elements 10z is installed in the magnetic sensor 2, a test operation may be performed for each Hall element 10z, or a batch test operation may be performed for the plurality of Hall elements 10z. Similarly, when the plurality of Hall elements 10xy is installed in the magnetic sensor 2, a test operation may be performed for each Hall element 10xy, or a batch test operation may be performed for the plurality of Hall elements 10xy.

Modifications

In the third and fourth embodiments, the magnetic sensor 2 capable of performing both the X-axis external magnetic field detection operation and the Y-axis external magnetic field detection operation, in addition to the Z-axis external magnetic field detection operation, has been described. The magnetic sensor 2 according to the third or fourth embodiment may have a configuration in which only one of the X-axis external magnetic field detection operation and the Y-axis external magnetic field detection operation can be executed while executing the Z-axis external magnetic field detection operation. That is, for example, in the magnetic sensor 2 according to the third or fourth embodiment, a Hall element for realizing only the detection of the X-axis magnetic field or a Hall element for realizing only the detection of the Y-axis magnetic field may be used as the Hall element 10xy.

Supplementary Notes

Supplementary notes are provided regarding the present disclosure in which specific configuration examples are shown through the above-described embodiments.

A magnetic sensor according to one aspect of the present disclosure (see FIG. 1) includes: a Hall element (10); a switch circuit (20) configured to switch a direction of a drive current supplied to the Hall element between a first direction and a second direction; a magnetic field detection circuit (30) configured to execute a detection operation (external magnetic field detection operation; see FIG. 5) for detecting a target magnetic field acting on the Hall element, based on a first difference between a Hall voltage generated in the Hall element when the drive current is supplied to the Hall element in the first direction and a Hall voltage generated in the Hall element when the drive current is supplied to the Hall element in the second direction; and a test magnetic field generation circuit (60) configured to generate a test magnetic field different from the target magnetic field in a test operation, wherein the magnetic field detection circuit is configured to, in the test operation, generate a test result signal ($V_{DEF\_TEST}$) corresponding to a second difference between a Hall voltage generated in the Hall element in a first test section and a Hall voltage generated in the Hall element in a second test section (see FIGS. 9 and 10), and wherein the direction of the drive current supplied to the Hall element is common to the first test section and the second test section, and a direction of the test magnetic field acting on the Hall element is opposite in the first test section and the second test section (First Configuration).

This makes it possible to perform a self-test of the magnetic sensor with a simple configuration.

The magnetic sensor of the First Configuration may further include an abnormality signal output circuit (46) configured to output a predetermined abnormality signal when the test result signal satisfies a predetermined condition (Second Configuration).

This makes it possible to notify the result of the self-test to the outside.

In the magnetic sensor of the Second Configuration (see FIG. 10) may further include a low-pass filter (32) that is inserted into a signal path for generating the test result signal from the Hall voltage generated in the Hall element in the first test section and the Hall voltage generated in the Hall element in the second test section (Third Configuration).

This makes it possible to suppress the influence of the AC component of the target magnetic field in the first and second test sections.

In the magnetic sensor of any one of the First to Third Configurations (see FIG. 6), the test magnetic field generation circuit may include a coil (61) and a current source (62) configured to generate the test magnetic field by supplying a current to the coil, and may be configured to supply the current to the coil in opposite directions in the first test section and the second test section (Fourth Configuration).

This makes it possible to easily reverse the direction of the test magnetic field acting on the Hall element between the first test section and the second test section.

The magnetic sensor of any one of the First to Fourth Configurations (see FIG. 21) may further include: a plurality of blocks including the Hall element, the switch circuit, and the magnetic field detection circuit, wherein a first magnetic field detection circuit in a first block (10z, 20z and 30z) of the plurality of blocks may be configured to detect a target magnetic field in a first axis direction acting on the Hall element of the first block in the detection operation, wherein a second magnetic field detection circuit in a second block (10xy, 20xy and 30xy) of the plurality of blocks may be configured to detect a target magnetic field in a second axis direction acting on the Hall element of the second block in the detection operation, wherein the test magnetic field generation circuit may be configured to, in the test operation, cause a magnetic field including a magnetic field component in the first axis direction to act as the test magnetic field on the Hall element of the first block, and cause a magnetic field including a magnetic field component in the second axis direction to act as the test magnetic field on the Hall element of the second block, and wherein the direction of the drive current supplied to the Hall element in each of the blocks may be common to the first test section and the second test section, and the direction of the test magnetic field acting on the Hall element in each of the blocks may be opposite in the first test section and the second test section (Fifth Configuration).

This makes it possible to perform a self-test for a plurality of axes.

In the magnetic sensor of the Fifth Configuration (see FIG. 28), the test magnetic field generation circuit may be configured to use a common coil (61') to, in the test operation, cause the magnetic field including the magnetic field component in the first axis direction to act as the test magnetic field on the Hall element of the first block, and cause the magnetic field including the magnetic field component in the second axis direction to act as the test magnetic field on the Hall element of the second block (Sixth Embodiment).

This makes it possible to perform multi-axis self-tests using a common coil. In realizing the multi-axis self-tests, the test magnetic field generation circuit can be simplified as compared with a configuration requiring a plurality of coils.

The embodiments of the present disclosure may be appropriately modified in various ways within the scope of the technical idea recited in the claims. The above embodiments are merely examples of the embodiments of the present disclosure. The meanings of the terms of the present disclosure or each constituent requirement are not limited to those described in the above embodiments. The specific numerical values appearing in the above description are merely examples. As a matter of course, the specific numerical values may be changed to various numerical values.

According to the present disclosure in some embodiments, it is possible to provide a magnetic sensor capable of realizing a self-test with a simple configuration.

While certain embodiments have been described, these embodiments have been presented by way of example only and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A magnetic sensor, comprising:
a Hall element;
a switch circuit configured to switch a direction of a drive current supplied to the Hall element between a first direction and a second direction;
a magnetic field detection circuit configured to execute a detection operation for detecting a target magnetic field acting on the Hall element, based on a first difference between a Hall voltage generated in the Hall element when the drive current is supplied to the Hall element in the first direction and a Hall voltage generated in the Hall element when the drive current is supplied to the Hall element in the second direction; and
a test magnetic field generation circuit configured to generate a test magnetic field different from the target magnetic field in a test operation,
wherein the magnetic field detection circuit is configured to, in the test operation, generate a test result signal corresponding to a second difference between a Hall voltage generated in the Hall element in a first test section and a Hall voltage generated in the Hall element in a second test section, and
wherein the direction of the drive current supplied to the Hall element is common to the first test section and the second test section, and a direction of the test magnetic field acting on the Hall element is opposite in the first test section and the second test section.

2. The magnetic sensor of claim 1, further comprising:
an abnormality signal output circuit configured to output a predetermined abnormality signal when the test result signal satisfies a predetermined condition.

3. The magnetic sensor of claim 2, further comprising:
a low-pass filter that is inserted into a signal path for generating the test result signal from the Hall voltage generated in the Hall element in the first test section and the Hall voltage generated in the Hall element in the second test section.

4. The magnetic sensor of claim 1, wherein the test magnetic field generation circuit includes a coil and a current source configured to generate the test magnetic field by supplying a current to the coil, and is configured to supply the current to the coil in opposite directions in the first test section and the second test section.

5. The magnetic sensor of claim 1, further comprising:
a plurality of blocks including the Hall element, the switch circuit, and the magnetic field detection circuit,
wherein a first magnetic field detection circuit in a first block of the plurality of blocks is configured to detect a target magnetic field in a first axis direction acting on the Hall element of the first block in the detection operation,
wherein a second magnetic field detection circuit in a second block of the plurality of blocks is configured to detect a target magnetic field in a second axis direction acting on the Hall element of the second block in the detection operation,
wherein the test magnetic field generation circuit is configured to, in the test operation, cause a magnetic field including a magnetic field component in the first axis direction to act as the test magnetic field on the Hall element of the first block, and cause a magnetic field including a magnetic field component in the second axis direction to act as the test magnetic field on the Hall element of the second block, and wherein the direction of the drive current supplied to the Hall element in each of the blocks are common to the first test section and the second test section, and the direction of the test magnetic field acting on the Hall element in each of the blocks is opposite in the first test section and the second test section.

6. The magnetic sensor of claim 5, wherein the test magnetic field generation circuit is configured to use a common coil to, in the test operation, cause the magnetic field including the magnetic field component in the first axis direction to act as the test magnetic field on the Hall element of the first block, and cause the magnetic field including the magnetic field component in the second axis direction to act as the test magnetic field on the Hall element of the second block.

* * * * *